US012764956B2

(12) United States Patent
Kim et al.

(10) Patent No.: US 12,764,956 B2
(45) Date of Patent: Oct. 13, 2026

(54) SEMICONDUCTOR DEVICE HAVING REDUCED INTERCELL INTERFERENCE AND ELECTRONIC SYSTEM INCLUDING THE SAME

(71) Applicant: Samsung Electronics Co., Ltd., Suwon-si (KR)

(72) Inventors: Byongju Kim, Suwon-si (KR); Dongsung Choi, Suwon-si (KR); Wonjun Park, Suwon-si (KR); Donghwa Lee, Suwon-si (KR); Jaemin Jung, Suwon-si (KR); Changheon Cheon, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 552 days.

(21) Appl. No.: 18/308,262

(22) Filed: Apr. 27, 2023

(65) Prior Publication Data

US 2024/0074195 A1 Feb. 29, 2024

(30) Foreign Application Priority Data

Aug. 24, 2022 (KR) ........................ 10-2022-0106059

(51) Int. Cl.
*H10B 43/27* (2023.01)
*H10B 43/40* (2023.01)

(52) U.S. Cl.
CPC ............. *H10B 43/27* (2023.02); *H10B 43/40* (2023.02)

(58) Field of Classification Search
CPC ........ H10B 51/00; H10B 51/10; H10B 51/20; H10B 51/30; H10B 51/40; H10B 51/50;
(Continued)

(56) References Cited

U.S. PATENT DOCUMENTS 10,181,475 B2 1/2019 Jhang et al.
10,396,092 B2 8/2019 Kanamori et al.
(Continued)

FOREIGN PATENT DOCUMENTS

KR 20000027561 A 5/2000
KR 10-2016-0139119 A 12/2016
(Continued)

OTHER PUBLICATIONS

Extended European Search Report corresponding to European Application No. 23182857.5 (9 pages) (Jan. 23, 2024).
(Continued)

*Primary Examiner* — William B Partridge
*Assistant Examiner* — Gustavo G Ramallo
(74) *Attorney, Agent, or Firm* — Wolf, Greenfield & Sacks, P.C.

(57) ABSTRACT

A semiconductor device includes a conductive pattern, an insulating pattern, a channel film extending in a vertical direction inside a channel hole, a charge trap pattern between the conductive pattern and the channel film inside the channel hole, a tunneling dielectric film between the charge trap pattern and the channel film, and a blocking dielectric film extending between the conductive pattern and the charge trap pattern and between the insulating pattern and the tunneling dielectric film. The insulating pattern includes a first insulating pattern overlapping the conductive pattern in the vertical direction and a second insulating pattern protruding in the lateral direction from the first insulating pattern into the channel hole and toward the channel film. The first insulating pattern has a first dielectric constant, and the second insulating pattern has a second dielectric constant that is lower than the first dielectric constant.

20 Claims, 31 Drawing Sheets

(58) Field of Classification Search
CPC ........ H10B 43/00; H10B 43/10; H10B 43/20; H10B 43/23; H10B 43/27; H10B 43/30; H10B 43/35; H10B 43/40; H10B 43/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 53/00; H10B 53/10; H10B 53/20; H10B 53/30; H10B 53/40; H10B 53/50
See application file for complete search history.

(56) References Cited

U.S. PATENT DOCUMENTS

| | | | | |
|---|---|---|---|---|
| 10,903,232 | B2 | 1/2021 | Tsutsumi | |
| 10,998,331 | B2 | 5/2021 | Zhou et al. | |
| 11,031,410 | B2 | 6/2021 | Park et al. | |
| 11,063,063 | B2 | 7/2021 | Zhang et al. | |
| 11,094,709 | B2 | 8/2021 | Choi et al. | |
| 11,244,954 | B2 | 2/2022 | Surthi et al. | |
| 11,502,097 | B2 | 11/2022 | Choi et al. | |
| 2002/0142569 | A1* | 10/2002 | Chang | H10B 69/00 257/E21.267 |
| 2011/0199825 | A1* | 8/2011 | Han | H10B 43/20 365/185.11 |
| 2018/0211969 | A1 | 7/2018 | Lue | |
| 2018/0219017 | A1 | 8/2018 | Goda et al. | |
| 2021/0074719 | A1 | 3/2021 | Lee et al. | |
| 2021/0074720 | A1 | 3/2021 | Son et al. | |
| 2021/0265383 | A1 | 8/2021 | Kim et al. | |
| 2021/0265384 | A1* | 8/2021 | Kim | H10D 64/035 |
| 2021/0296458 | A1 | 9/2021 | Okada et al. | |
| 2022/0084953 | A1 | 3/2022 | Noguchi et al. | |

FOREIGN PATENT DOCUMENTS

| | | | |
|---|---|---|---|
| KR | 10-2018-0012640 | A | 2/2018 |
| KR | 10-2021-0029871 | A | 3/2021 |
| KR | 10-2021-0106295 | A | 8/2021 |
| KR | 10-2022-0114818 | A | 8/2022 |

OTHER PUBLICATIONS

Kim et al. “Characterization of low-dielectric-constant SiOC thin films deposited by PECVD for interlayer dielectrics of multilevel interconnection” Surface and Coatings Technology 171(1-3):39-45 (2003).

Moslehi et al. “Thermal nitridation of Si and SiO2 for VLSI” IEEE Transactions on Electron Devices 32(2):106-123 (Feb. 1985).

* cited by examiner

II - II'

SEMICONDUCTOR DEVICE HAVING REDUCED INTERCELL INTERFERENCE AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2022-0106059, filed on Aug. 24, 2022, in the Korean Intellectual Property Office, the disclosure of which is incorporated by reference herein in its entirety.

FIELD

The inventive concept relates to a semiconductor device and an electronic system including the same, and more particularly, to a semiconductor device including a non-volatile vertical memory device and an electronic system including the semiconductor device.

BACKGROUND

With demand for highly integrated high-capacity semiconductor devices, a vertical semiconductor device in which a plurality of memory cells are stacked on a substrate in a vertical direction to increase memory capacity has been proposed. When the density of cells stacked in the vertical direction is increased in the vertical memory device, a distance between adjacent cells in the vertical direction may be reduced, and thus, the reliability of semiconductor devices may be degraded due to cell interference caused by the diffusion of charges between the adjacent cells.

SUMMARY

The inventive concept provides a semiconductor device having a structure capable of improving the reliability of the semiconductor device having a device region with a reduced area with the downscaling trend.

According to an aspect of the inventive concept, there is provided a semiconductor device including a conductive pattern extending in a lateral direction parallel to a surface of a substrate on the substrate, an insulating pattern extending parallel to the conductive pattern in the lateral direction on the substrate, a channel film extending in a vertical direction to the surface of the substrate inside a channel hole passing through the conductive pattern and the insulating pattern, a charge trap pattern between the conductive pattern and the channel film inside the channel hole, a tunneling dielectric film between the charge trap pattern and the channel film, and a blocking dielectric film extending in the vertical direction inside the channel hole between the conductive pattern and the charge trap pattern and between the insulating pattern and the tunneling dielectric film, wherein the insulating pattern includes a first insulating pattern overlapping the conductive pattern in the vertical direction and a second insulating pattern protruding in the lateral direction from the first insulating pattern into the channel hole and toward the channel film, the first insulating pattern having a first dielectric constant, and the second insulating pattern having a second dielectric constant that is lower than the first dielectric constant.

According to another aspect of the inventive concept, there is provided a semiconductor device including a plurality of conductive patterns extending on a substrate in a lateral direction parallel to a surface of the substrate, the plurality of conductive patterns overlapping each other in a vertical direction to the surface of the substrate, a plurality of insulating patterns alternatingly stacked between the plurality of conductive patterns, respectively, the plurality of insulating patterns extending in the lateral direction, a channel film extending in the vertical direction inside a channel hole passing through the plurality of conductive patterns and the plurality of insulating patterns, a plurality of charge trap patterns between the plurality of conductive patterns and the channel film inside the channel hole, the plurality of charge trap patterns being spaced apart from each other in the vertical direction, a tunneling dielectric film between the plurality of charge trap patterns and the channel film, and a blocking dielectric film extending in the vertical direction inside the channel hole between the plurality of conductive patterns and the plurality of charge trap patterns and between the plurality of insulating patterns and the tunneling dielectric film, wherein each of the plurality of insulating patterns includes a first insulating pattern overlapping the plurality of conductive patterns in the vertical direction and a second insulating pattern protruding in the lateral direction from the first insulating pattern into the channel hole and toward the channel film, the first insulating pattern having a first dielectric constant, and the second insulating pattern having a second dielectric constant that is lower than the first dielectric constant.

According to another aspect of the inventive concept, there is provided an electronic system including a main substrate, a semiconductor device on the main substrate, and a controller electrically connected to the semiconductor device on the main substrate, wherein the semiconductor device includes a conductive pattern on a substrate, the conductive pattern extending in a lateral direction parallel to a surface of the substrate, an insulating pattern on the substrate, the insulating pattern extending in the lateral direction parallel to the conductive pattern, a channel film extending in a vertical direction to the surface of the substrate inside a channel hole passing through the conductive pattern and the insulating pattern, a charge trap pattern between the conductive pattern and the channel film inside the channel hole, a tunneling dielectric film between the charge trap pattern and the channel film, and a blocking dielectric film extending in the vertical direction inside the channel hole between the conductive pattern and the charge trap pattern and between the insulating pattern and the tunneling dielectric film, wherein the insulating pattern includes a first insulating pattern overlapping the conductive pattern in the vertical direction and a second insulating pattern protruding in the lateral direction from the first insulating pattern into the channel hole and toward the channel film, the first insulating pattern having a first dielectric constant, and the second insulating pattern having a second dielectric constant that is lower than the first dielectric constant.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EMBODIMENTS

Figure 1:
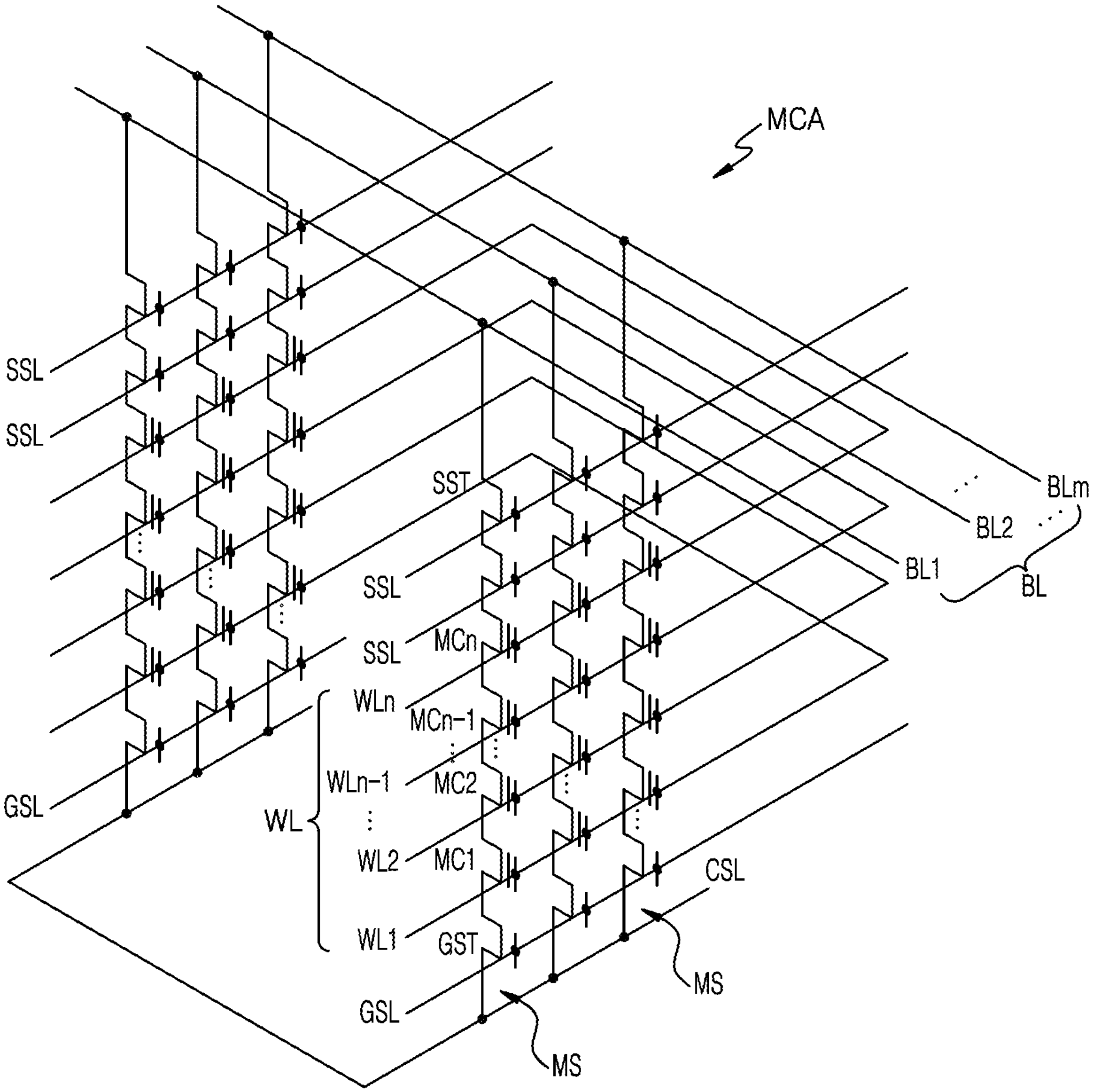
FIG. 1 is an equivalent circuit diagram of a memory cell array of a semiconductor device according to embodiments.

Hereinafter, embodiments will be described in detail with reference to the accompanying drawings. The same reference numerals are used to denote the same elements in the drawings, and repeated descriptions thereof are omitted. The terms "first," "second," etc., may be used herein merely to distinguish one element or layer from another. Elements or layers that are referred to as "directly on" or "in direct contact with" one another may not include intervening elements or layers therebetween.

FIG. 1 is an equivalent circuit diagram of a memory cell array MCA of a semiconductor device, according to embodiments. FIG. 1 illustrates an equivalent circuit diagram of a vertical NAND flash memory device having a vertical channel structure.

Referring to FIG. 1, the memory cell array MCA may include a plurality of memory cell strings MS. The memory cell array MCA may include a plurality of bit lines BL: BL1, BL2, . . . , and BLm, a plurality of word lines WL: WL1, WL2, . . . , WLn−1, and WLn, at least one string selection line SSL, at least one ground selection line GSL, and a common source line CSL. The plurality of memory cell strings MS may be formed between the plurality of bit lines BL: BL1, BL2, . . . , and BLm and the common source line CSL.

Each of the plurality of memory cell strings MS may include a string selection transistor SST, a ground selection transistor GST, and a plurality of memory cell transistors MC1, MC2, . . . , MCn−1, and MCn. A drain region of the string selection transistor SST may be connected to the bit lines BL: BL1, BL2, . . . , and BLm, and a source region of the ground selection transistor GST may be connected to the common source line CSL. The common source line CSL may be a region to which source regions of a plurality of ground selection transistors GST are connected in common.

The string selection transistor SST may be connected to the string selection line SSL, and the ground selection transistor GST may be connected to the ground selection line GSL. The plurality of memory cell transistors MC1, MC2, . . . , MCn−1, and MCn may be respectively connected to the plurality of word lines WL: WL1, WL2, . . . , WLn−1, and WLn.

Figure 2:
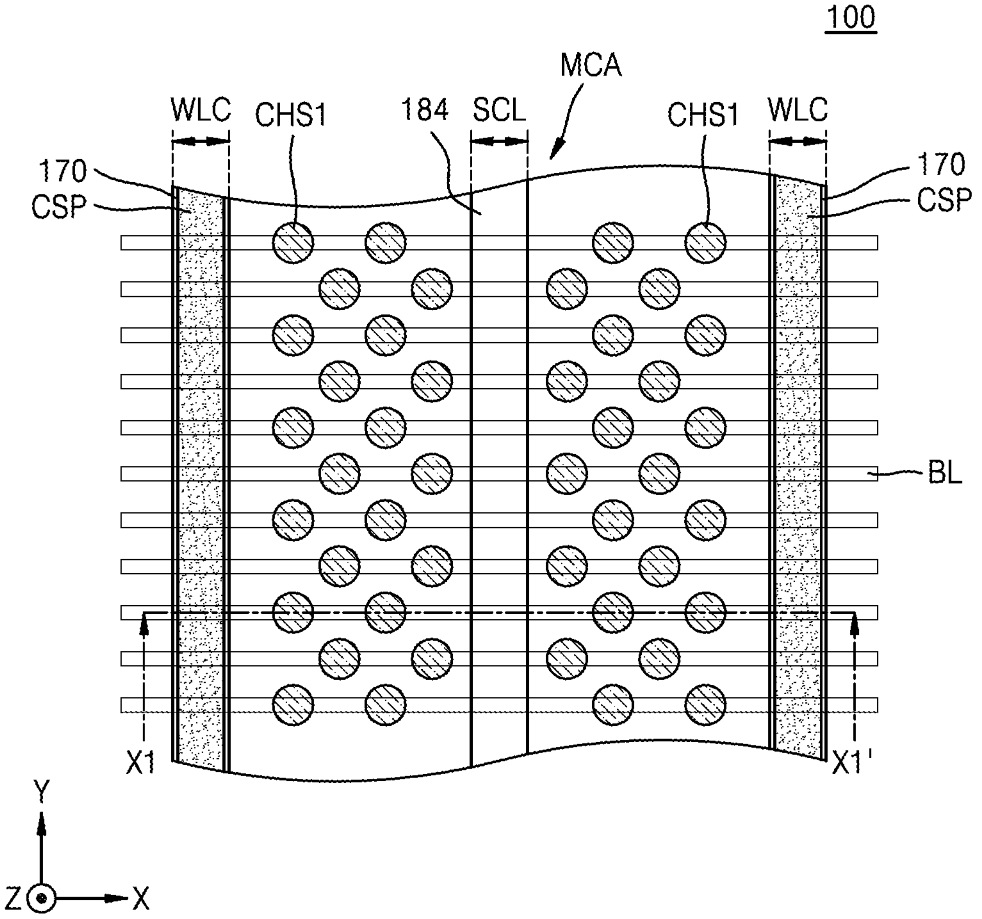
FIG. 2 is a plan view of main components of a semiconductor device according to embodiments.
Figure 3:
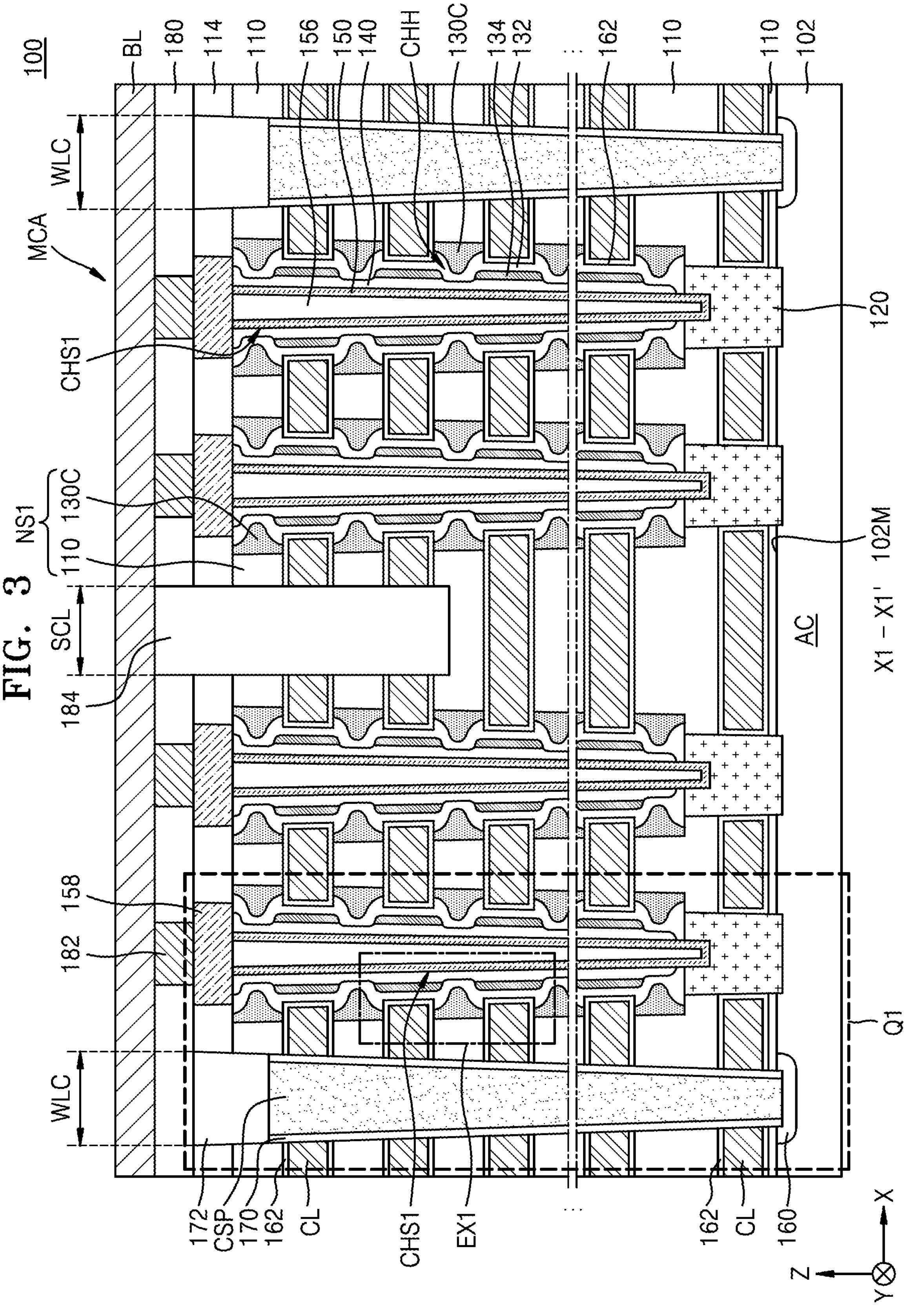
FIG. 3 is a cross-sectional view taken along line X1-X1' of FIG. 2.
Figure 4:
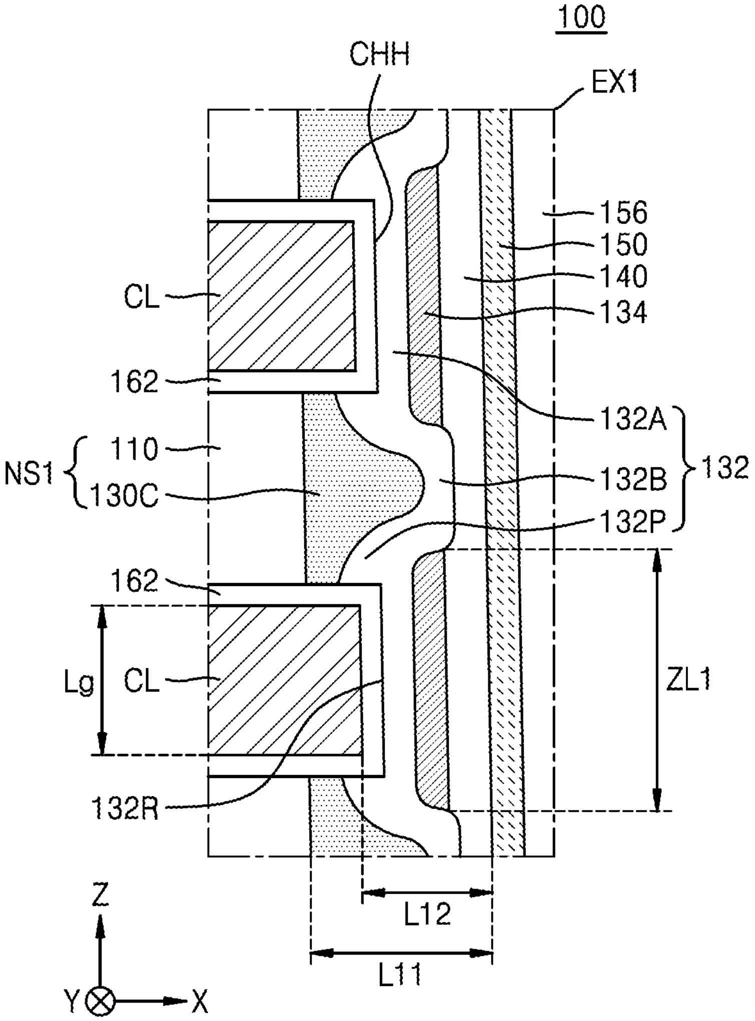
FIG. 4 is an enlarged cross-sectional view of a dashed region EX1 of FIG. 3.

FIG. 2 is a plan view of main components of a semiconductor device 100 according to embodiments, and FIG. 3 is a cross-sectional view taken along line X1-X1' of FIG. 2. FIG. 4 is an enlarged cross-sectional view of a dashed region EX1 of FIG. 3.

Referring to FIGS. 2, 3, and 4, the semiconductor device 100 may include a substrate 102 having an active area AC. A memory cell array MCA may be formed on the active area AC of the substrate 102. The memory cell array MCA may have the circuit configuration as that described with reference to FIG. 1.

The substrate 102 may have a main surface 102M, which extends in an X direction and a Y direction. In embodiments, the substrate 102 may include silicon (Si), germanium (Ge), or silicon germanium (SiGe). In other embodiments, the substrate 102 may include a silicon-on-insulator (SOI) substrate or a germanium-on-insulator (GeOI) substrate.

A plurality of conductive patterns CL may extend along an X-Y plane in a lateral direction parallel to the main surface 102M on the substrate 102. Also, the plurality of conductive patterns CL may be spaced apart from each other in a vertical direction to the main surface 102M of the substrate 102, and overlap each other. A plurality of insulating patterns NS1 may extend in a lateral direction on the substrate 102. The plurality of insulating patterns NS1 may be arranged one-by-one (i.e., alternatingly stacked) between the plurality of conductive patterns CL, respectively.

A plurality of channel holes CHH may be formed to pass through the plurality of conductive patterns CL and the plurality of insulating patterns NS1, and a plurality of channel structures CHS1 may extend in the vertical direction (Z direction) inside the plurality of channel holes CHH. Each of the plurality of channel structures CHS1 may include a semiconductor pattern 120, a channel film 150, a buried insulating film 156, and a drain region 158. The semiconductor pattern 120 may be in contact with the substrate 102 and partially fill the channel hole CHH. The channel film 150 may be in contact with the semiconductor pattern 120 and extend in the vertical direction (Z direction) inside the channel hole CHH. The buried insulating film 156 may fill an inner space of the channel film 150. The drain region 158 may contact the channel film 150 and fill an upper portion adjacent to an entrance of the channel hole CHH. In embodiments, the channel film 150 may have a cylindrical shape having an inner space, and the inner space of the channel film 150 may be filled by the buried insulating film 156. The channel film 150 may include doped polysilicon or undoped polysilicon. The buried insulating film 156 may include silicon oxide, silicon nitride, silicon oxynitride, or a combination thereof. In embodiments, the buried insulating film 156 may be omitted. In this case, the channel film 150 may have a pillar structure having no inner space. The drain region 158 may include doped polysilicon, a metal, a conductive metal nitride, or a combination thereof. The metal included in the drain region 158 may include tungsten, nickel, cobalt, or tantalum. A plurality of drain regions 158 may be insulated from each other by a hard insulating film 114. The hard insulating film 114 may include an oxide film, a nitride film, or a combination thereof.

A plurality of charge trap patterns 134 may be around the plurality of channel structures CHS1. As used herein, the term "charge trap pattern" may be referred to as a charge storage pattern, and the terms "charge trap pattern" and "charge storage pattern" may be used interchangeably. The plurality of charge trap patterns 134 may be apart (i.e., spaced apart or separated or otherwise isolated) from each other in the vertical direction (Z direction) inside the channel hole CHH. Each of the plurality of charge trap patterns 134 may be between the conductive pattern CL and the channel film 150. Inside the channel hole CHH, the plurality of charge trap patterns 134 may extend in a straight line in a direction away from the substrate 102. In the vertical direction (Z direction), a length ZL1 of each of the plurality of charge trap patterns 134 may be greater than a length Lg of the conductive pattern CL.

In embodiments, each of the plurality of charge trap patterns 134 may have a width or thickness of about 3 nm to about 10 nm (e.g., a width of about 4 nm to about 8 nm) in a lateral direction (e.g., X direction of FIGS. 3 and 4), without being limited thereto.

Inside the channel hole CHH, a tunneling dielectric film 140 may be between the plurality of charge trap patterns 134 and the channel film 150. A blocking dielectric film 132 may extend long in the vertical direction (Z direction) inside the channel hole CHH to pass between the plurality of conductive patterns CL and the plurality of charge trap patterns 134 and between the plurality of insulating patterns NS1 and the tunneling dielectric film 140. A portion of the blocking dielectric film 132 may be between the conductive pattern CL and the charge trap pattern 134 inside the channel hole CHH, and another portion of the blocking dielectric film 132 may be between the insulating pattern NS1 and the charge trap pattern 134 outside the channel hole CHH.

Each of the plurality of charge trap patterns 134 may be a region in which electrons that have passed through the tunneling dielectric film 140 from the channel film 150 may be stored. Each of the plurality of charge trap patterns 134 may include a silicon nitride film, a boron nitride film, a silicon boron nitride film, or doped polysilicon. The tunneling dielectric film 140 may include a silicon oxide film, a hafnium oxide film, an aluminum oxide film, a zirconium oxide film, a tantalum oxide film, or a combination thereof.

Each of the plurality of insulating patterns NS1 may include a first insulating pattern 110 having a first dielectric constant and a second insulating pattern 130C having a second dielectric constant. The second dielectric constant may be lower than the first dielectric constant. The first insulating pattern 110 and the second insulating pattern 130C may be in contact with each other, and an interface between the first insulating pattern 110 and the second insulating pattern 130C may be at a position overlapping the conductive pattern CL in the vertical direction (Z direction).

In embodiments, in each of the plurality of insulating patterns NS1, the first insulating pattern 110 may include a silicon oxide film (e.g., a $SiO_2$ film), and the second insulating pattern 130C may include SiOC, SiOCN, SiOB, SiBN, SiOF, or a combination thereof. As used herein, each of the terms "SiOC," "SiOCN," "SiOB," "SiBN," and "SiOF" refers to a material including elements included therein, without referring to a chemical formula representing a stoichiometric relationship.

In each of the plurality of insulating patterns NS1, the first insulating pattern 110 may overlap the plurality of conductive patterns CL in the vertical direction (Z direction). In each of the plurality of insulating patterns NS1, the second insulating pattern 130C may protrude in the lateral direction (e.g., X direction of FIGS. 3 and 4) from a sidewall of the first insulating pattern 110, which faces the channel film 150, toward the channel film 150 into the channel hole CHH.

As shown in FIGS. 3 and 4, the second insulating pattern 130C may include a portion of which a width or length in the vertical direction (Z direction) gradually reduces or narrows toward the channel film 150. In other words, a protrusion of the second insulating pattern 130C may become narrower as it laterally extends towards the channel film 150. In the lateral direction (e.g., X direction of FIGS. 3 and 4), a first shortest distance L11 between a sidewall of the first insulating pattern 110, which is closest to the channel film 150, and the channel film 150 may be greater than a second shortest distance L12 between a sidewall of the conductive pattern CL, which is closest to the channel film 150, and the channel film 150.

The second insulating pattern 130C may include a portion overlapping the conductive pattern CL in the vertical direction (Z direction) outside the channel hole CHH and a portion overlapping the blocking dielectric film 132 in the vertical direction (Z direction) inside the channel hole CHH. In the vertical direction (Z direction), the portion of the second insulating pattern 130C, which overlaps the blocking dielectric film 132 in the vertical direction (Z direction), may have a smaller thickness than the portion of the second insulating pattern 130C, which overlaps the conductive pattern CL in the vertical direction (Z direction).

The blocking dielectric film 132 may include a plurality of first portions 132A facing the conductive pattern CL and a plurality of second portions 132B facing the second insulating pattern 130C of the insulating pattern NS1. The blocking dielectric film 132 may further include a plurality of protrusions 132P, which protrude out of the channel hole CHH in a lateral direction toward the first insulating pattern 110 of the insulating pattern NS1. The first portion 132A of the blocking dielectric film 132 may be in contact with the charge trap pattern 134. The second portion 132B of the blocking dielectric film 132 may be in contact with the tunneling dielectric film 140. Each of the first portion 132A and the second portion 132B of the blocking dielectric film 132 may include a portion that extends in the vertical direction (Z direction) inside the channel hole CHH.

Each of the plurality of charge trap patterns 134 in the channel hole CHH may include a portion of which a length in the vertical direction (Z direction) gradually increases or widens toward the channel film 150. In the vertical direction (Z direction), the second portion 132B of the blocking dielectric film 132 may be between every two adjacent ones of the plurality of charge trap patterns 134 and may laterally protrude beyond the surface of the charge trap pattern 134 facing the conductive pattern CP. The second portion 132B of the blocking dielectric film 132 may laterally protrude more toward the channel film 150 than the plurality of charge trap patterns 134 inside the channel hole CHH (i.e., may protrude in the lateral direction beyond the surface of the charge trap pattern 134 facing the tunnel dielectric film 140) and may be in contact with the tunneling dielectric film 140. As such, the second portions 132B of the blocking dielectric film 132 may laterally extend between adjacent charge trap patterns 134 to define a plurality of segments 134 that are spaced apart and electrically isolated from one another along the vertical direction.

The blocking dielectric film 132 may extend in zigzag in the vertical direction (Z direction) inside the channel hole CHH. The charge trap pattern 134 may include a surface facing the conductive pattern CL, a bottom surface facing the substrate 102, and a top surface opposite to the bottom surface, each of which may be each in contact with the blocking dielectric film 132. The blocking dielectric film 132 may include portions respectively surrounding the plurality of charge trap patterns 134 in a C shape.

In embodiments, the blocking dielectric film 132 may include a silicon oxide film, a silicon nitride film, or a metal oxide having a higher dielectric constant than silicon oxide. The metal oxide may include hafnium oxide, aluminum oxide, zirconium oxide, tantalum oxide, or a combination thereof. In a lateral direction (e.g., X direction of FIGS. 3 and 4), a width or thickness of the blocking dielectric film 132 may be in a range of about 3 nm to about 10 nm (e.g., a range of about 4 nm to about 8 nm), without being limited thereto.

The semiconductor device 100 may further include a blocking dielectric liner 162 surrounding the conductive pattern CL between every two adjacent ones of the plurality of insulating patterns NS1. The blocking dielectric liner 162 may include a portion in contact with the blocking dielectric film 132.

The blocking dielectric film 132 may include a plurality of recess surfaces 132R, which are recessed toward the plurality of conductive patterns CL. The recess surface 132R of the blocking dielectric film 132 may be in contact with the blocking dielectric liner 162. The blocking dielectric film 132 may surround a portion of the conductive pattern CL with the blocking dielectric liner 162 therebetween. As shown in FIG. 4, the first portion 132A of the blocking dielectric film 132 may cover a surface of the conductive pattern CL, which faces the charge trap pattern 134, between the conductive pattern CL and the charge trap pattern 134. The protrusion 132P of the blocking dielectric film 132 may cover a bottom surface or a top surface of the conductive pattern CL.

The blocking dielectric liner 162 may include a portion, which is between the conductive pattern CL and the insulating pattern NS1 and in contact with the conductive pattern CL and the insulating pattern NS1, and a portion, which is between the conductive pattern CL and the blocking dielectric film 132 and in contact with the conductive pattern CL and the blocking dielectric film 132. The blocking dielectric liner 162 may include a silicon oxide film, a high-k dielectric film, or a combination thereof. The high-k dielectric film may have a metal oxide film having a higher dielectric constant than a silicon oxide film. For example, the high-k dielectric film may include hafnium oxide, aluminum oxide, zirconium oxide, or a combination thereof, without being limited thereto.

The tunneling dielectric film 140 may include a portion in contact with the charge trap pattern 134, a portion in contact with the blocking dielectric film 132, and a portion in contact with the channel film 150. The tunneling dielectric film 140 may pass between the charge trap pattern 134 and the channel film 150 and between the second portion 132B of the blocking dielectric film 132 and the channel film 150 and extend long in a direction in which the channel film 150 extends. The tunneling dielectric film 140 may include a silicon oxide film. A width or thickness of each of the tunneling dielectric film 140 and the channel film 150 in a lateral direction may be in a range of about 3 nm to about 10 nm, without being limited thereto.

A width of each of the plurality of conductive patterns CL and the plurality of insulating patterns NS1 in a first lateral direction (X direction) may be defined by a plurality of word line cut regions WLC. The plurality of conductive patterns CL may be a predetermined distance apart from each other by the plurality of word line cut regions WLC and repeatedly arranged.

A plurality of common source regions 160 may extend in a second lateral direction (Y direction) in the substrate 102. The plurality of common source regions 160 may be impurity regions that are heavily doped with n-type impurities. Portions of the plurality of word line cut regions WLC may be filled by a common source pattern CSP. The common source pattern CSP may constitute the common source line CSL shown in FIG. 1. The common source pattern CSP may extend long in the second lateral direction (Y direction) on the plurality of common source regions 160. Insulating spacers 170 may cover sidewalls of the common source pattern CSP in the word line cut region WLC. The insulating spacers 170 may electrically insulate the common source pattern CSP from the plurality of conductive patterns CL. The common source pattern CSP and the insulating spacer 170 may be covered by a capping insulating film 172. The common source pattern CSP may include a metal (e.g., tungsten, copper, or aluminum); a conductive metal nitride (e.g., titanium nitride and tantalum nitride); a transition metal (e.g., titanium and tantalum); or a combination thereof. Each of the insulating spacer 170 and the capping insulating film 172 may include a silicon oxide film, a silicon nitride film, a silicon oxynitride film, or a combination thereof. A metal silicide film (not shown) for lowering contact resistance may be between the common source region 160 and the common source pattern CSP. For example, the metal silicide film may include cobalt silicide, tungsten silicide, and/or nickel silicide.

The plurality of conductive patterns CL, each of which is between two adjacent ones of the word line cut regions WLC, may constitute the ground selection line GSL, the plurality of word lines WL: WL1, WL2, . . . , WLn−1, and WLn, and the string selection line SSL, which have been described with reference to FIG. 1. The number of conductive patterns CL stacked in the vertical direction (Z direction) on the substrate 102 may be variously selected as needed. In embodiments, one of the plurality of conductive patterns CL, which is closest to the substrate 102, may constitute the ground selection line GSL. From among the plurality of conductive patterns CL, each of two conductive patterns CL that are farthest from the substrate 102 may constitute the string selection line SSL. The string selection line SSL may include portions separated from each other by a string selection line cut region SCL. The string selection line cut region SCL may be filled with an insulating film 184. The insulating film 184 may include an oxide film, a nitride film, an air gap, or a combination thereof. As used herein, the term "air gap" may refer to a space including other gases that may be in the atmosphere or during a manufacturing process.

The plurality of conductive patterns CL may include a metal (e.g., tungsten, nickel, cobalt, and tantalum), a metal silicide (e.g., tungsten silicide, nickel silicide, cobalt silicide, and tantalum silicide), doped polysilicon, or a combination thereof.

In the memory cell array MCA, a plurality of bit lines BL may extend long in the first lateral direction (X direction) on the plurality of channel structures CHS1. A plurality of bit line contact pads 182 may be between the plurality of channel structures CHS1 and the plurality of bit lines BL. The drain region 158 of each of the plurality of channel structures CHS1 may be connected to a corresponding one of the plurality of bit lines BL through the bit line contact pad 182. The plurality of bit line contact pads 182 may be insulated from each other by an upper insulating film 180. The upper insulating film 180 may include an oxide film, a nitride film, or a combination thereof.

Because the plurality of charge trap patterns 134 are inside the channel hole CHH, the semiconductor device 100 shown in FIGS. 3 and 4 may be advantageously adopted to implement semiconductor devices that are highly scaled in the lateral direction and the vertical direction, as compared to the case in which the plurality of charge trap patterns 134 are outside the channel hole CHH. In addition, inside one channel hole CHH, the plurality of charge trap patterns 134 may be apart or separated or otherwise isolated from each other with the blocking dielectric film 132 therebetween in the vertical direction (Z direction). Therefore, even when a distance between cells adjacent to each other in the vertical direction (Z direction) is relatively small in a vertical memory device, a structure capable of improving reliability may be provided by reducing or inhibiting cell interference due to the diffusion of charges between the adjacent cells.

In addition, each of the plurality of insulating patterns NS1 may have a first insulating pattern 110 having a first dielectric constant and a second insulating pattern 130C having a second dielectric constant. The second dielectric constant may be lower than the first dielectric constant. Because the plurality of insulating patterns NS1 include the second insulating pattern 130C having a relatively low dielectric constant, an undesired capacitive coupling effect may be reduced between the plurality of conductive patterns CL. Accordingly, the reliability of the semiconductor device 100 may be improved.

Figure 5:
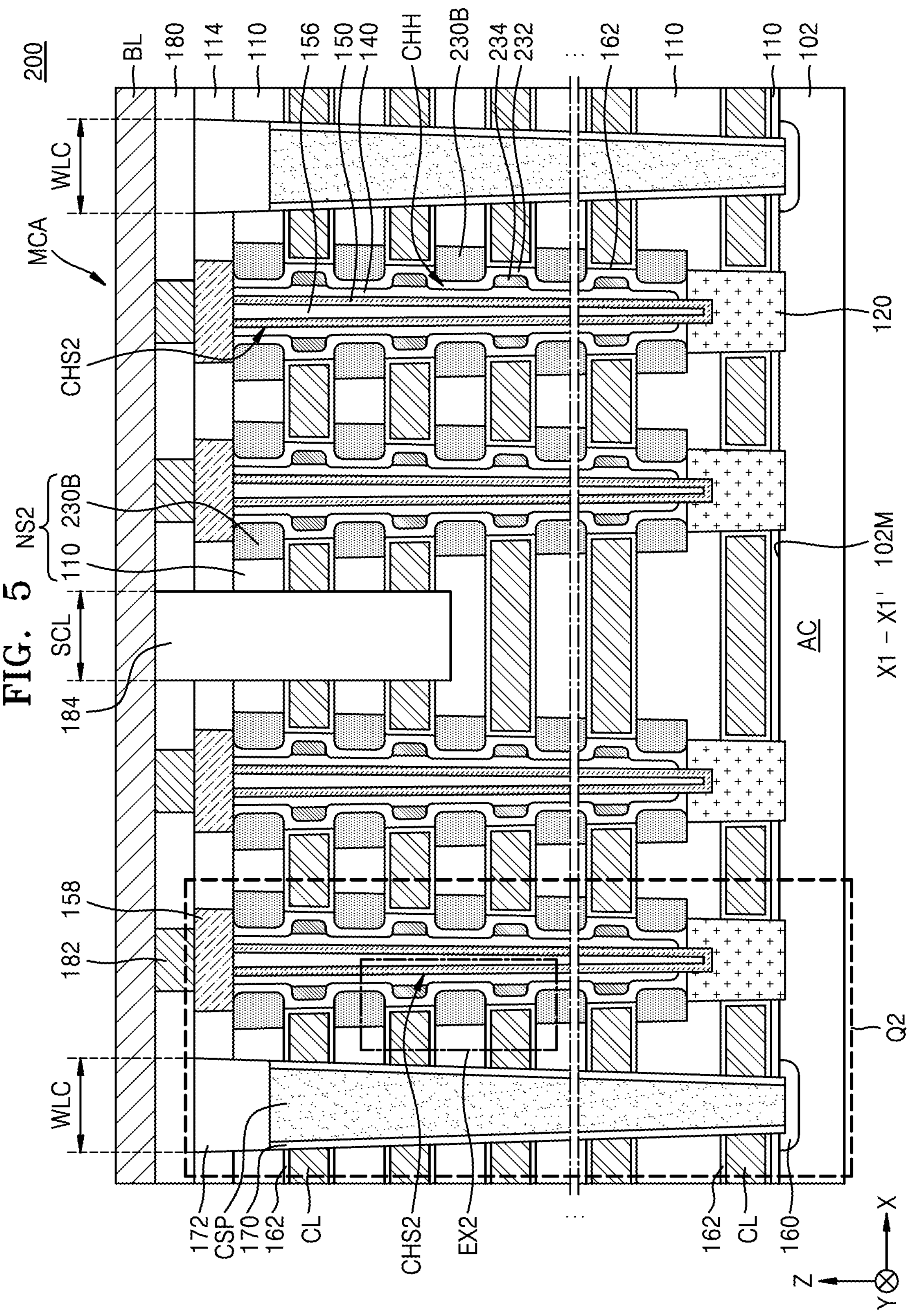
FIG. 5 is a cross-sectional view of a semiconductor device according to embodiments.
Figure 6:
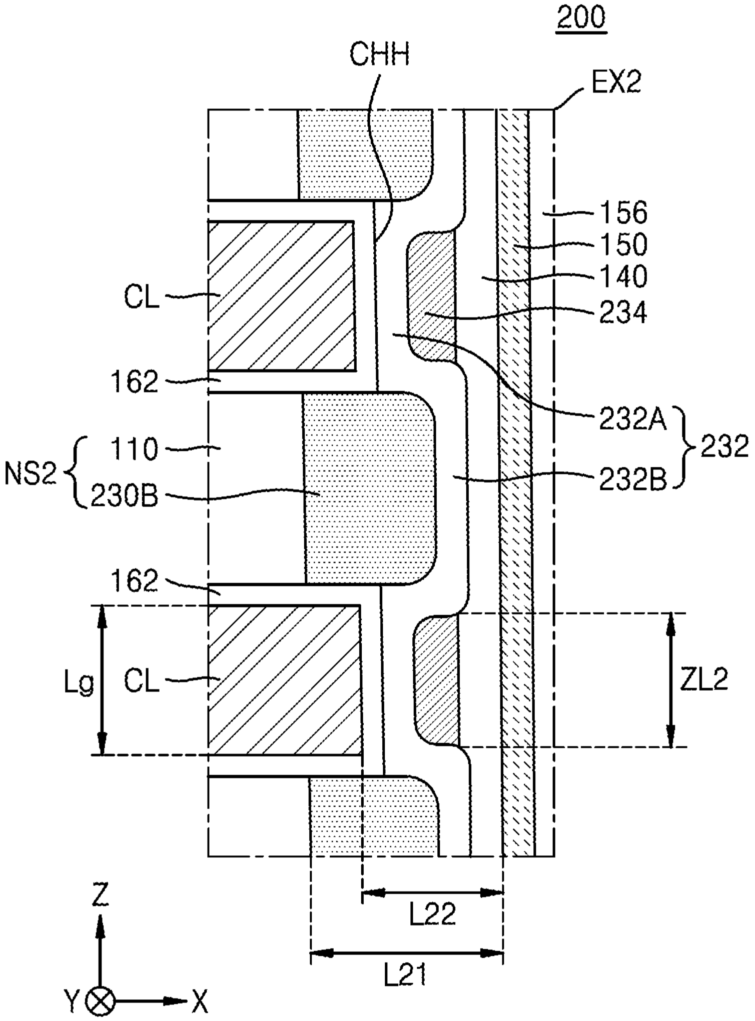
FIG. 6 is an enlarged cross-sectional view of a dashed region EX2 of FIG. 5.

FIG. 5 is a cross-sectional view of a semiconductor device 200 according to embodiments, and FIG. 6 is an enlarged cross-sectional view of a dashed region EX2 of FIG. 5. FIG. 5 illustrates an enlarged cross-sectional configuration of a portion corresponding to a cross-section taken along line X1-X1' of FIG. 2. In FIGS. 5 and 6, the same reference numerals are used to denote the same elements as in FIGS. 3 and 4, and thus, repeated descriptions thereof will be omitted.

Referring to FIGS. 5 and 6, the semiconductor device 200 may include a memory cell array MCA configured with the equivalent circuit shown in FIG. 1 and may substantially have the same configuration as the semiconductor device 100 described with reference to FIGS. 2 to 4. However, the semiconductor device 200 may include a plurality of insulating patterns NS2, which are alternatingly arranged or stacked one-by-one between a plurality of conductive patterns CL, respectively.

Each of the plurality of insulating patterns NS2 may include a first insulating pattern 110 having a first dielectric constant and a second insulating pattern 230B having a second dielectric constant. The second dielectric constant may be lower than the first dielectric constant. The second insulating pattern 230B may protrude in a lateral direction (e.g., X direction of FIGS. 5 and 6) from a sidewall of the first insulating pattern 110, which faces the channel film 150, toward the channel film 150 into the channel hole CHH. The second insulating pattern 230B may include a portion of which a width or length along the vertical direction (Z direction) gradually reduces or narrows with lateral extension toward the channel film 150.

In the lateral direction (e.g., X direction of FIGS. 5 and 6), a first shortest distance L21 between a sidewall of the first insulating pattern 110, which is closest to the channel film 150, and the channel film 150 may be greater than a second shortest distance L22 between a sidewall of the conductive pattern CL, which is closest to the channel film 150, and the channel film 150.

A plurality of channel holes CHH may be formed to pass through the plurality of conductive patterns CL and the plurality of insulating patterns NS2, and a plurality of channel structures CHS2 may extend in the vertical direction (Z direction) inside the plurality of channel holes CHH. Each of the plurality of channel structures CHS2 may include a semiconductor pattern 120, a channel film 150, a buried insulating film 156, and a drain region 158.

A plurality of charge trap patterns 234 may be around the plurality of channel structures CHS2. The plurality of charge trap patterns 234 may be apart or separated or otherwise isolated from each other in the vertical direction (Z direction) inside the channel hole CHH. Each of the plurality of charge trap patterns 234 may be between the conductive pattern CL and the channel film 150. In the vertical direction (Z direction), a length ZL2 of each of the plurality of charge trap patterns 234 may be less than a length Lg of the conductive pattern CL.

Inside the channel hole CHH, a tunneling dielectric film 140 may be between the plurality of charge trap patterns 234 and the channel film 150. A blocking dielectric film 232 may extend long in the vertical direction (Z direction) inside the channel hole CHH to pass between the plurality of conductive patterns CL and the plurality of charge trap patterns 234 and between the plurality of insulating patterns NS2 and the tunneling dielectric film 140. The blocking dielectric film 232 may be only inside the channel hole CHH and may not include a portion protruding out of the channel hole CHH. A portion of the blocking dielectric film 232 may be between the conductive pattern CL and the charge trap pattern 234 inside the channel hole CHH, and another portion of the blocking dielectric film 232 may be between the insulating pattern NS2 and the charge trap pattern 134 inside the channel hole CHH.

The blocking dielectric film 232 may include a plurality of first portions 232A facing the conductive pattern CL and a plurality of second portions 232B facing the second insulating pattern 230B of the insulating pattern NS2. The first portion 232A of the blocking dielectric film 232 may be in contact with the charge trap pattern 234. The second portion 232B of the blocking dielectric film 232 may be in contact with the tunneling dielectric film 140. Each of the first portion 232A and the second portion 232B of the blocking dielectric film 232 may include a portion, which extends in the vertical direction (Z direction) inside the channel hole CHH. Details of the second insulating pattern 230B, the blocking dielectric film 232, and the charge trap pattern 234 may substantially be the same as those of the second insulating pattern 130C, the blocking dielectric film 132, and the charge trap pattern 134, which have been described with reference to FIGS. 3 and 4.

Because the plurality of charge trap patterns 234 are inside the channel hole CHH, the semiconductor device 200 shown in FIGS. 5 and 6 may be advantageously adopted to implement semiconductor devices that are highly scaled in the lateral direction and the vertical direction, as compared to the case in which the plurality of charge trap patterns 234 are outside the channel hole CHH. Inside one channel hole CHH, the plurality of charge trap patterns 234 may be apart or separated or otherwise isolated from each other with the blocking dielectric film 232 therebetween in the vertical direction (Z direction). Therefore, even when a distance between cells adjacent to each other in the vertical direction (Z direction) is relatively small in a vertical memory device, a structure capable of improving reliability may be provided by inhibiting cell interference due to the diffusion of charges between the adjacent cells.

In addition, each of the plurality of insulating patterns NS2 may include a first insulating pattern 110 having a first dielectric constant and a second insulating pattern 230B having a second dielectric constant. The second dielectric constant may be lower than the first dielectric constant. Because the plurality of insulating patterns NS2 include the second insulating pattern 230B having a relatively low dielectric constant, an undesired capacitive coupling effect may be reduced between the plurality of conductive patterns CL. Accordingly, the reliability of the semiconductor device 200 may be improved.

Figure 7:
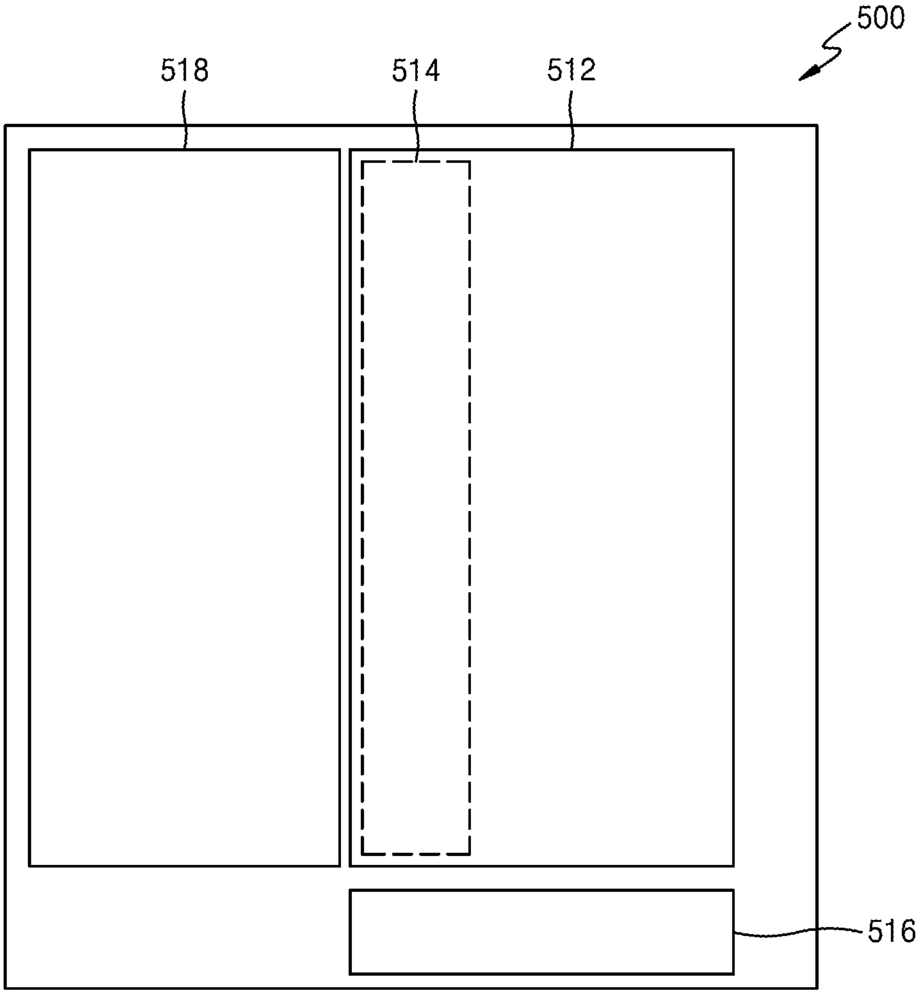
FIG. 7 is a plan layout diagram of main areas of a semiconductor device according to embodiments.

FIG. 7 is a plan layout diagram of main areas of a semiconductor device 500 according to embodiments.

Referring to FIG. 7, the semiconductor device 500 may include a memory cell area 512, a first peripheral circuit area 514, a second peripheral circuit area 516, and a bonding pad area 518. The memory cell area 512 may include a plurality of memory cell arrays MCA, each of which is configured with the equivalent circuit described with reference to FIG. 1. Each of the first peripheral circuit area 514 and the second peripheral circuit area 516 may include a control unit configured to control the inputting and outputting of data to and from the memory cell area 512. Peripheral circuits configured to drive vertical memory cells included in the memory cell area 512 may be in the first peripheral circuit area 514 and the second peripheral circuit area 516.

The first peripheral circuit area 514 may vertically overlap the memory cell area 512, and thus, a planar size of a chip including the semiconductor device 500 may be reduced. In embodiments, the peripheral circuits in the first peripheral circuit area 514 may include circuits capable of processing data input into or output from the memory cell area 512 at a high speed. For example, the peripheral circuits in the first peripheral circuit area 514 may include a page buffer, a latch circuit, a cache circuit, a column decoder, a sense amplifier, or a data in/out (I/O) circuit.

The second peripheral circuit area 516 may be at one side of the memory cell area 512 in an area that does not overlap the memory cell area 512 and the first peripheral circuit area 514. The peripheral circuits in the second peripheral circuit area 516 may include a row decoder. In embodiments, differently from that shown in FIG. 7, at least a portion of the second peripheral circuit area 516 may be under (or otherwise overlapping in the vertical (e.g., Z-)direction) the memory cell area 512.

The bonding pad area 518 may be formed at another side of the memory cell area 512. The bonding pad area 518 may be an area in which wirings connected to word lines of each of the vertical memory cells of the memory cell area 512 are formed.

Figure 8:
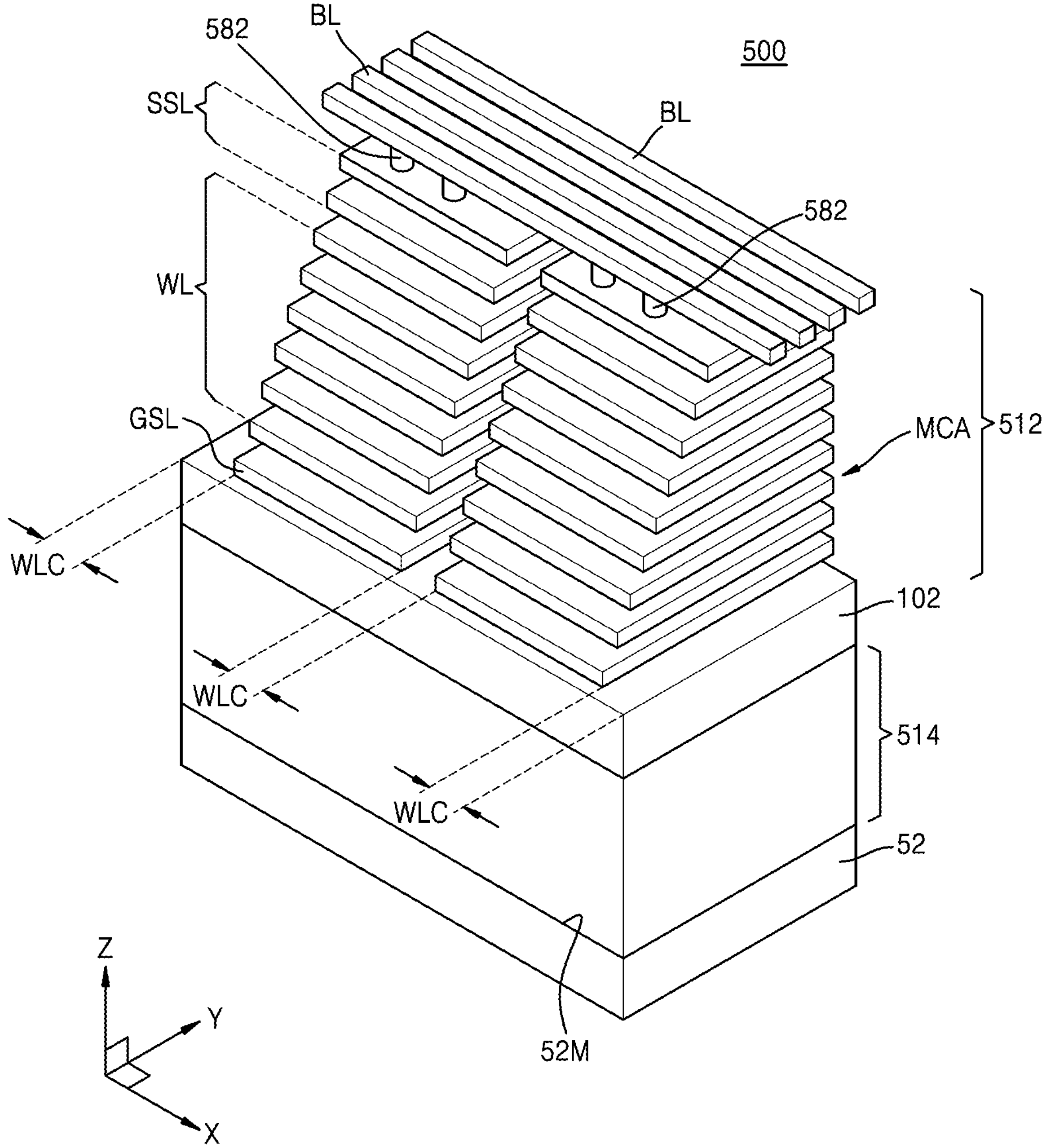
FIG. 8 is a perspective view of a partial region of the semiconductor device shown in FIG. 7.
Figure 9:
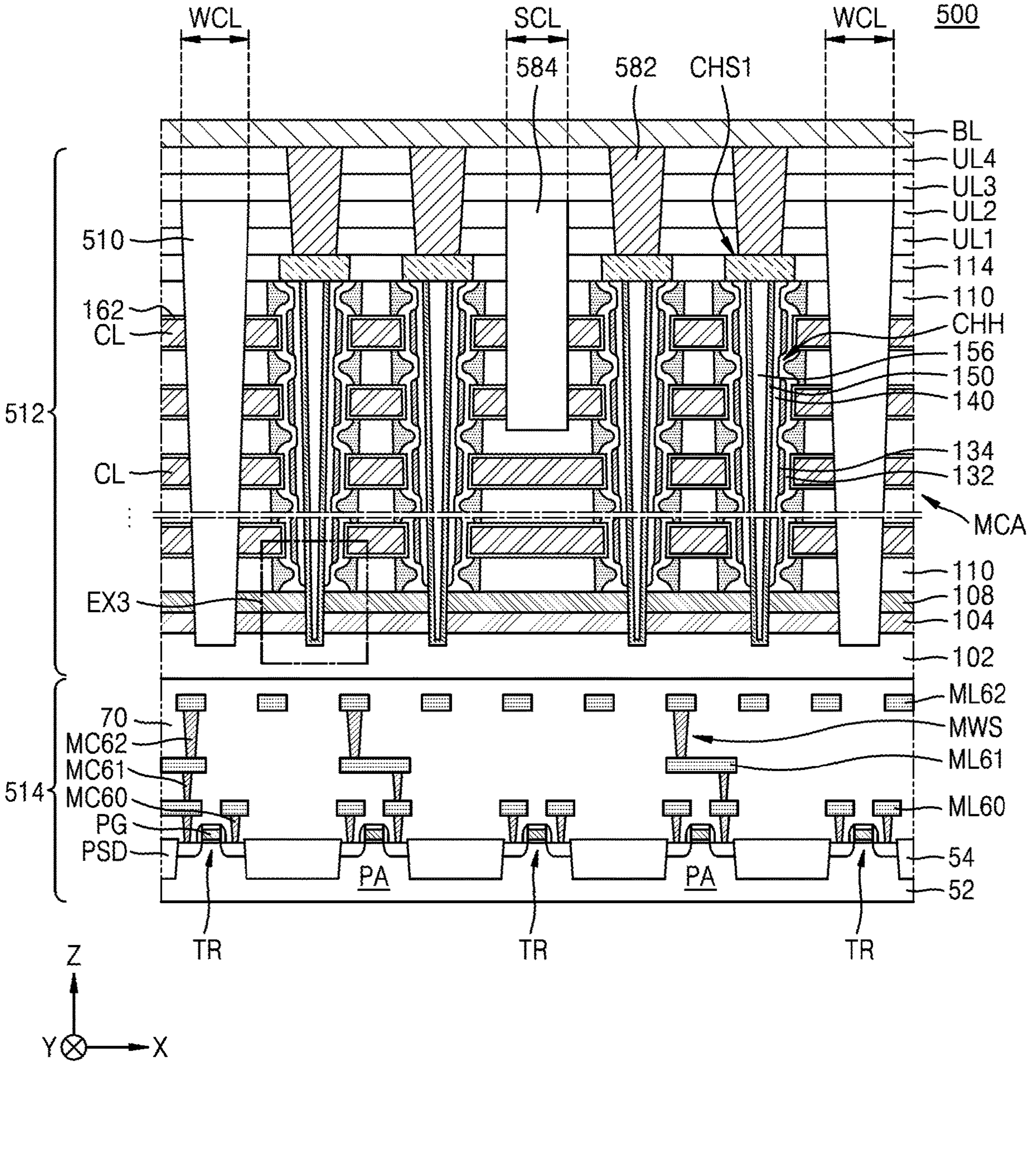
FIG. 9 is a cross-sectional view of a partial region of the semiconductor device shown in FIG. 7.

FIG. 8 is a perspective view of a partial region of the semiconductor device 500 shown in FIG. 7, and FIG. 9 is a cross-sectional view of a partial region of the semiconductor device 500 shown in FIG. 7. In FIGS. 8 and 9, the same reference numerals are used to denote the same elements as in FIGS. 2 to 4, and thus, repeated descriptions thereof will be omitted.

Referring to FIGS. 8 and 9, the semiconductor device 500 may include a first peripheral circuit area 514 formed at a first level on a peripheral circuit substrate 52 and a memory cell area 512 formed at a second level on the peripheral circuit substrate 52. The second level may be higher than the first level. As used herein, the term "level" refers to a height or distance from the peripheral circuit substrate 52 in a vertical direction (or Z direction of FIGS. 8 and 9). The first level may be closer to the peripheral circuit substrate 52 than the second level on the peripheral circuit substrate 52.

The first peripheral circuit area 514 may include a plurality of peripheral circuits formed on the peripheral circuit substrate 52 and a multilayered wiring structure MWS configured to connect the plurality of peripheral circuits to each other or a multilayered wiring structure MWS configured to connect the plurality of peripheral circuits to components in the memory cell area 512.

The peripheral circuit substrate 52 may have a main surface 52M, which extends in an X direction and a Y direction. A peripheral active area PA may be defined by a device isolation film 54 in the peripheral circuit substrate 52. Details of the peripheral circuit substrate 52 may substantially be the same as those of the substrate 102, which has been described with reference to FIGS. 3 and 4. A plurality of transistors TR, which constitute the first peripheral circuit area 514, may be formed on the peripheral active area PA of the peripheral circuit substrate 52. Each of the plurality of transistors TR may include a peripheral gate PG and peripheral source/drain regions PSD formed on both (e.g., opposing) sides of the peripheral gate PG in the peripheral active area PA. In embodiments, unit elements, such as resistors and capacitors, may be further formed in the first peripheral circuit area 514. An interlayer insulating film 70 may be formed on the plurality of transistors TR. The interlayer insulating film 70 may include a silicon oxide film, a silicon nitride film, a silicon oxynitride (SiON) film, a silicon oxycarbonitride (SiOCN) film, or a combination thereof.

In the first peripheral circuit area 514, the multilayered wiring structure MWS may include a plurality of peripheral circuit wiring layers (e.g., ML60, ML61, and ML62) and a plurality of peripheral circuit contacts (e.g., MC60, MC61, and MC62). Some of the peripheral circuit wiring layers ML60, ML61, and ML62 may be electrically connected to the plurality of transistors TR. The peripheral circuit contacts MC60, MC61, and MC62 may connect some selected from the peripheral circuit wiring layers ML60, ML61, and ML62 to each other. The plurality of peripheral circuit wiring layers (e.g., ML60, ML61, and ML62) and the plurality of peripheral circuit contacts (e.g., MC60, MC61, and MC62) may be covered by the interlayer insulating film 70.

The plurality of peripheral circuit wiring layers (e.g., ML60, ML61, and ML62) and the plurality of peripheral circuit contacts (e.g., MC60, MC61, and MC62) may each include a metal, a conductive metal nitride, a metal silicide, or a combination thereof. For example, the plurality of peripheral circuit wiring layers (e.g., ML60, ML61, and ML62) and the plurality of peripheral circuit contacts (e.g., MC60, MC61, and MC62) may each include a conductive material, such as tungsten, molybdenum, titanium, cobalt, tantalum, nickel, tungsten silicide, titanium silicide, cobalt silicide, tantalum silicide, and nickel silicide. FIG. 9 pertains to an example in which the peripheral circuit wiring layers ML60, ML61, and ML62 have a triple wiring structure in a vertical direction (Z direction), but the inventive concept is not limited thereto. For example, the peripheral circuit wiring layers ML60, ML61, and ML62 may have a multilayered wiring structure including two layers or four or more layers.

The memory cell area 512 on the first peripheral circuit area 514 may include a substrate 102, a first conductive plate 104, a second conductive plate 108, and a memory cell array MCA. The substrate 102, the first conductive plate 104, and the second conductive plate 108 may extend in a lateral direction to cover the first peripheral circuit area 514. The memory cell array MCA may substantially have the same configuration as described with reference to FIGS. 3 and 4. FIG. 9 pertains to an example in which the memory cell array MCA of the semiconductor device 500 substantially has the same configuration as that described with reference to FIGS. 3 and 4, but the inventive concept is not limited thereto. For example, the memory cell array MCA of the semiconductor device 500 may include the memory cell array MCA having the configuration described with reference to FIGS. 5 and 6 or a memory cell array having a structure that is variously modified and changed within the scope of the inventive concept.

The first conductive plate 104 and the second conductive plate 108 may serve as the common source line CSL described with reference to FIG. 1. Each of the first conductive plate 104 and the second conductive plate 108 may function as a source region configured to supply current to vertical memory cells in the memory cell array MCA.

In embodiments, each of the first conductive plate 104 and the second conductive plate 108 may include a doped polysilicon film, a metal film, or a combination thereof. The metal film may include tungsten (W), without being limited thereto.

On the substrate 102, a plurality of word line cut structures 510 may extend long in the second lateral direction (Y direction) in the plurality of word line cut regions WLC. Each of the plurality of word line cut structures 510 may include an insulating structure. In embodiments, the insulating structure may include silicon oxide, silicon nitride, silicon oxynitride, or a low-k dielectric material. For example, the insulating structure may include a silicon oxide film, a silicon nitride film, a silicon oxynitride (SiON) film, a silicon oxycarbonitride (SiOCN) film, a silicon carbonitride (SiCN) film, or a combination thereof. In other embodiments, at least a portion of the insulating structure may include an air gap.

Between two adjacent word line cut structures 510, a plurality of conductive patterns CL may be stacked on the second conductive plate 108 and overlap each other in the vertical direction (Z direction). The plurality of conductive patterns CL may include a ground selection line GSL, a plurality of word lines WL, and a string selection line SSL, which have been described with reference to FIG. 1.

As shown in FIG. 9, each of two upper ones of the plurality of conductive patterns CL may be separated in a first lateral direction (X direction) with an insulating film 584 formed in the string selection line cut region SCL therebetween. The two conductive patterns CL, which are apart or separated or otherwise isolated from each other with the insulating film 584 therebetween, may each constitute the string selection line SSL described with reference to FIG. 1.

In the memory cell area 512, a first upper insulating film UL1, a second upper insulating film UL2, a third upper insulating film UL3, and a fourth upper insulating film UL4 may be sequentially formed on a plurality of channel structures CHS1 and the hard insulating film 114. The insulating film 584 may pass through the first upper insulating film UL1 and the second upper insulating film UL2 in the vertical direction (Z direction). A top surface of the insulating film 584, a top surface of the word line cut structure 510, and a top surface of the second upper insulating film UL2 may extend at substantially the same vertical level relative to the substrate 102. Details of the insulating film 584 may substantially be the same as those of the insulating film 184, which have been described with reference to FIG. 3. Each of the first upper insulating film UL1, the second upper insulating film UL2, the third upper insulating film UL3, and the fourth upper insulating film UL4 may include an oxide film, a nitride film, or a combination thereof.

In the memory cell array MCA, a plurality of bit lines BL may be on the fourth upper insulating film UL4. The plurality of bit lines BL may extend parallel to each other in the first lateral direction (X direction). The plurality of channel structures CHS1 may be respectively connected to the plurality of bit lines BL through a plurality of contacts plugs 582 passing through the first upper insulating film UL1, the second upper insulating film UL2, the third upper insulating film UL3, and the fourth upper insulating film UL4.

Figure 10:
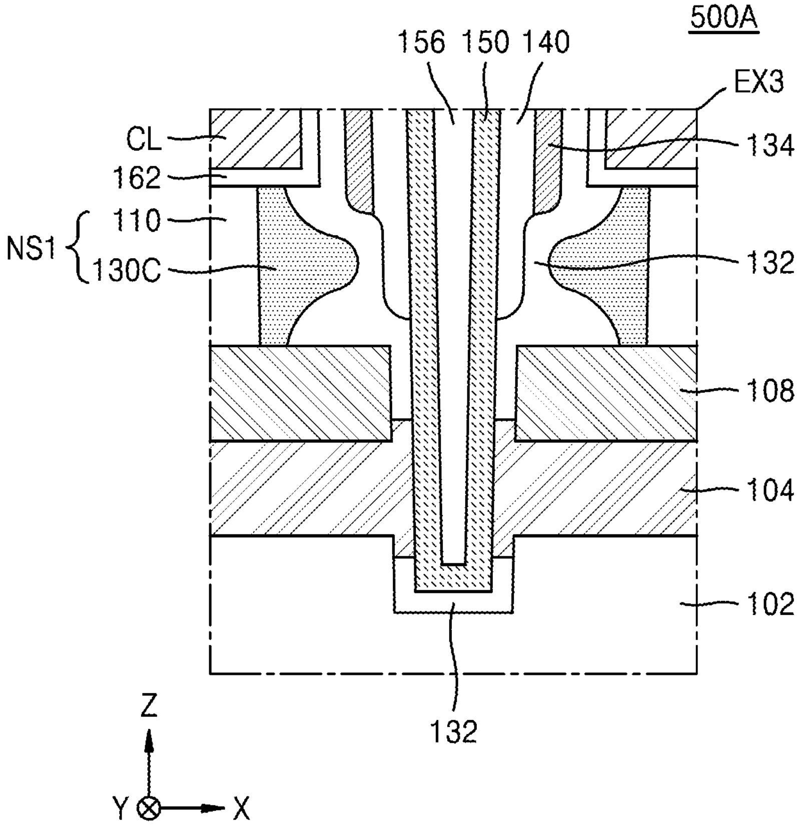
FIG. 10 is a cross-sectional view of a semiconductor device according to embodiments.

FIG. 10 is a cross-sectional view of a semiconductor device 500A according to embodiments. FIG. 10 illustrates an enlarged cross-sectional configuration of a region corresponding to a dashed region EX3 of FIG. 9. In FIG. 10, the same reference numerals are used to denote the same elements as in FIG. 9, and thus, repeated descriptions thereof will be omitted.

Referring to FIG. 10, the semiconductor device 500A may substantially have the same configuration as the semiconductor device 500 described with reference to FIGS. 7 to 9. However, the first conductive plate 104 may pass through a partial region of a blocking dielectric film 132 in a lateral direction (X direction and/or Y direction) and contact a channel film 150. The first conductive plate 104 may include a portion vertically overlapping the blocking dielectric film 132. A thickness (Z-directional size) of a portion of the first conductive plate 104, which vertically overlaps the blocking dielectric film 132, may be greater than a thickness (Z-directional size) of a portion of the first conductive plate 104, which vertically overlaps the second conductive plate 108. The blocking dielectric film 132 may include a portion covering a sidewall of the channel film 150 at a higher level than the first conductive plate 104 and a portion covering a bottom surface of the channel film 150 at a lower level than the first conductive plate 104. The channel film 150 may be spaced apart from the substrate 102 with a lowest portion of the blocking dielectric film 132 therebetween. The sidewall of the channel film 150 may be in contact with the first conductive plate 104 and electrically connected to the first conductive plate 104. The second conductive plate 108 may be spaced apart from the channel film 150 with a partial region of the blocking dielectric film 132 therebetween.

Next, a method of manufacturing a semiconductor device, according to embodiments, will be described in detail.

Figure 11A:
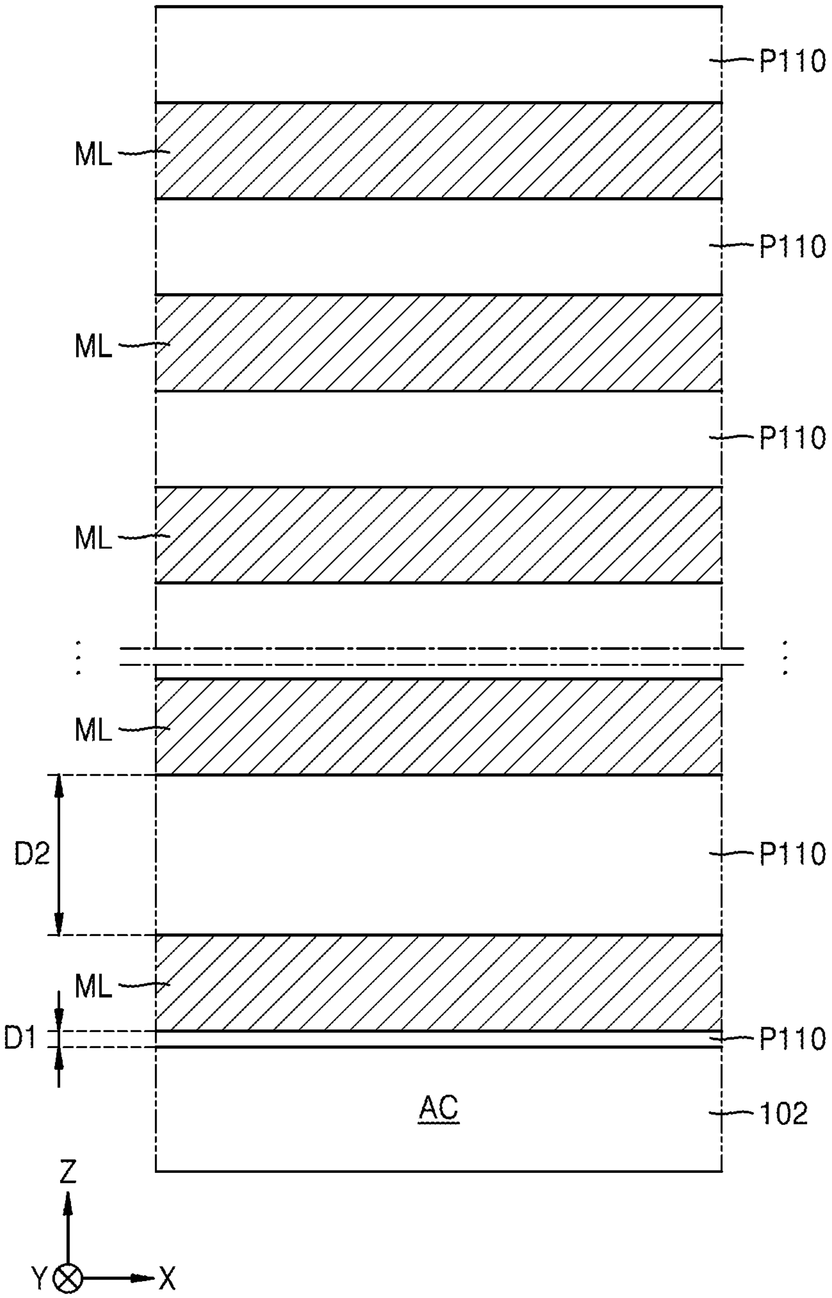
FIGS. 11A, 11B, 11C, 11D, 11E, 11F, 11G, 11H, 11I, 11J, 11K, 11M, 11N, and 11O are cross-sectional views of a process sequence of a method of manufacturing a semiconductor device, according to embodiments.
Figure 11B:
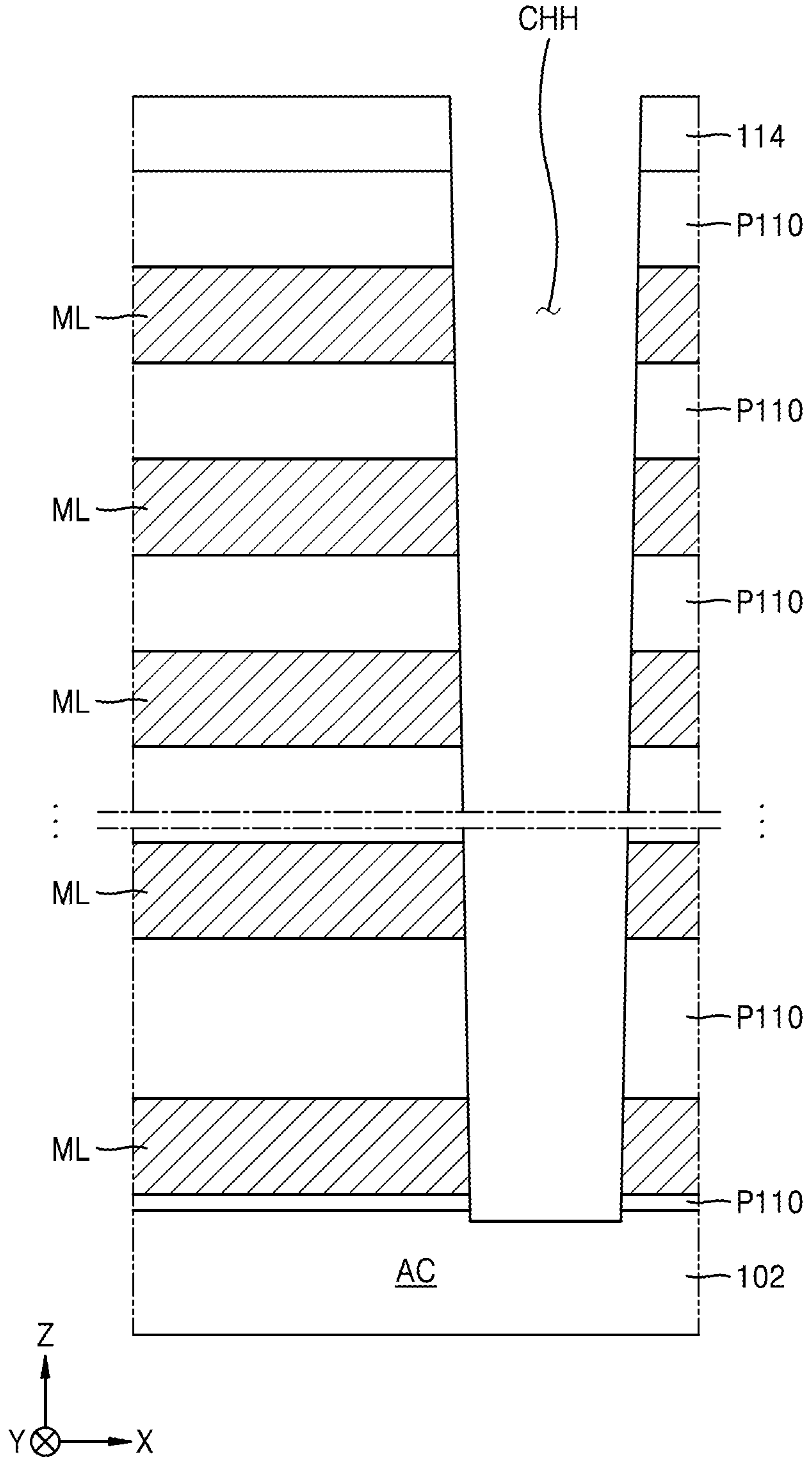
Figure 11C:
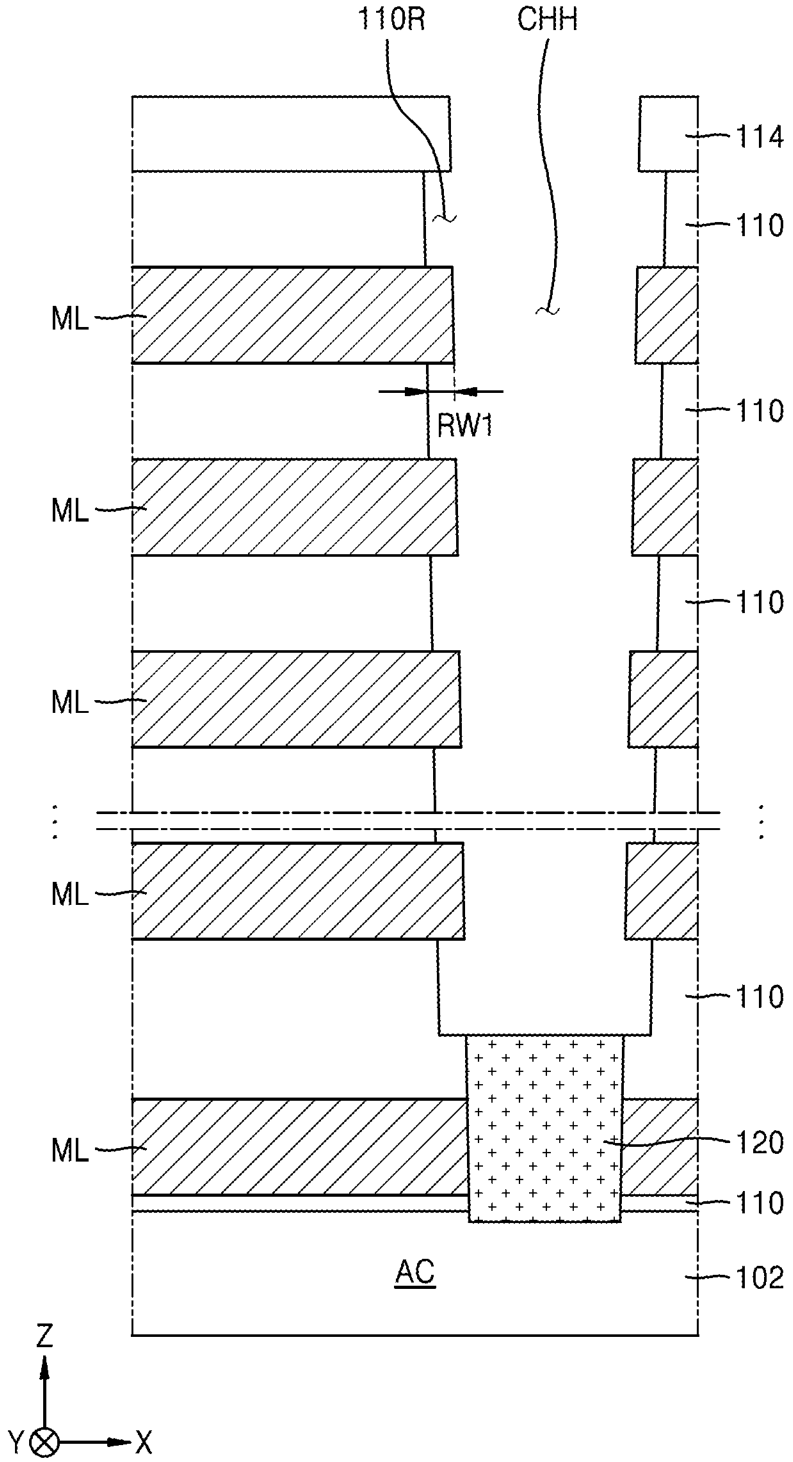
Figure 11D:
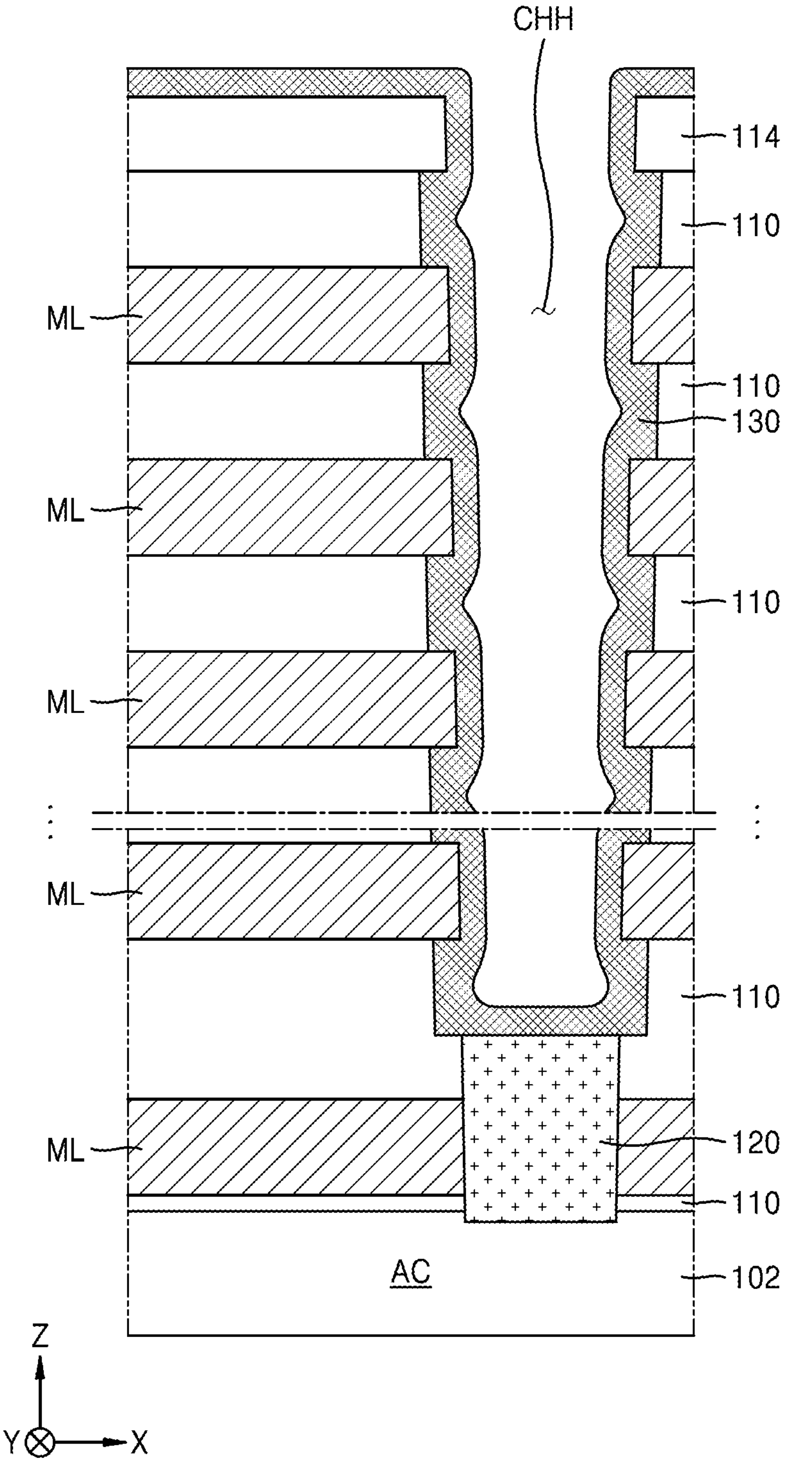
Figure 11E:
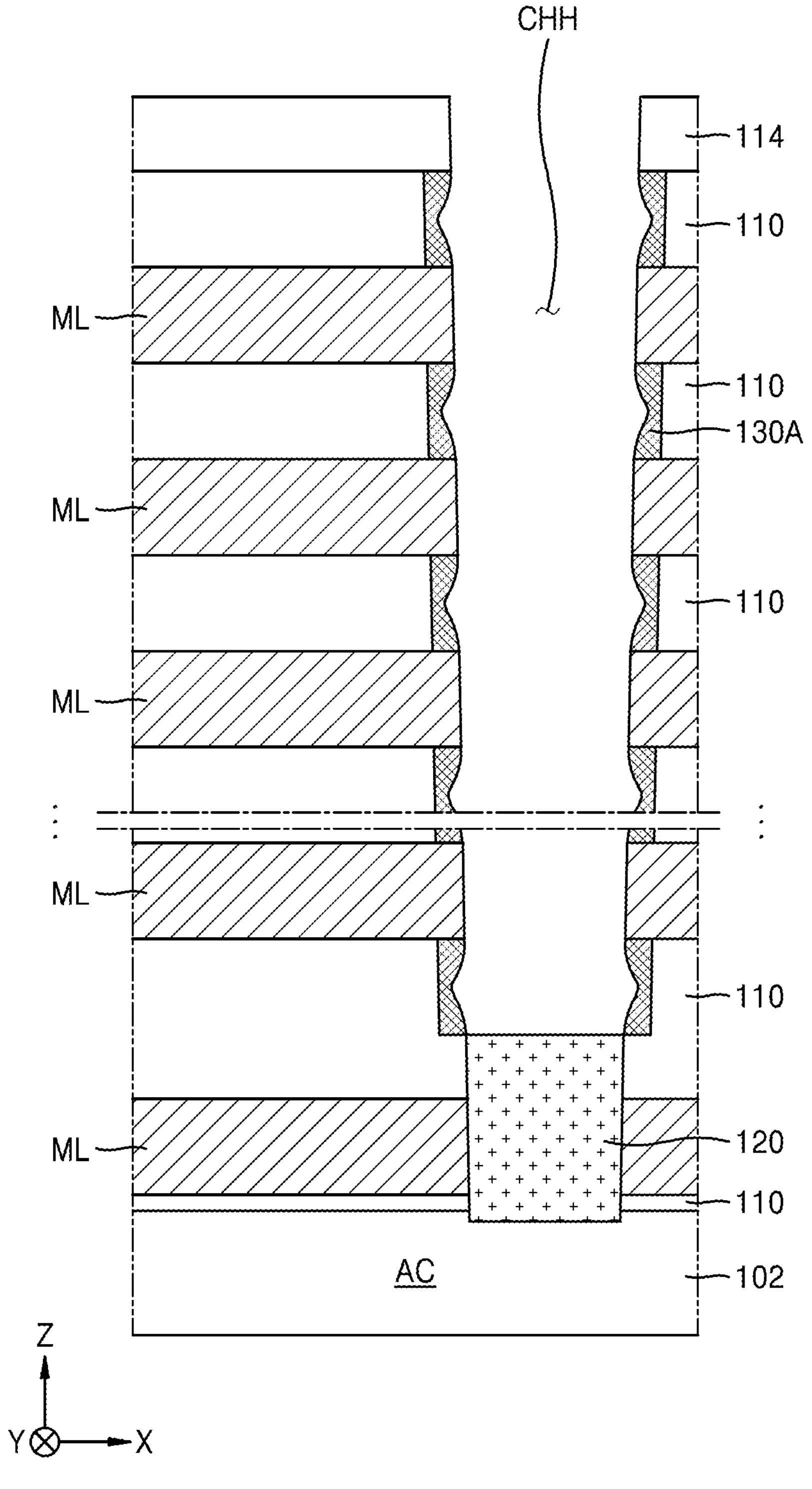
Figure 11F:
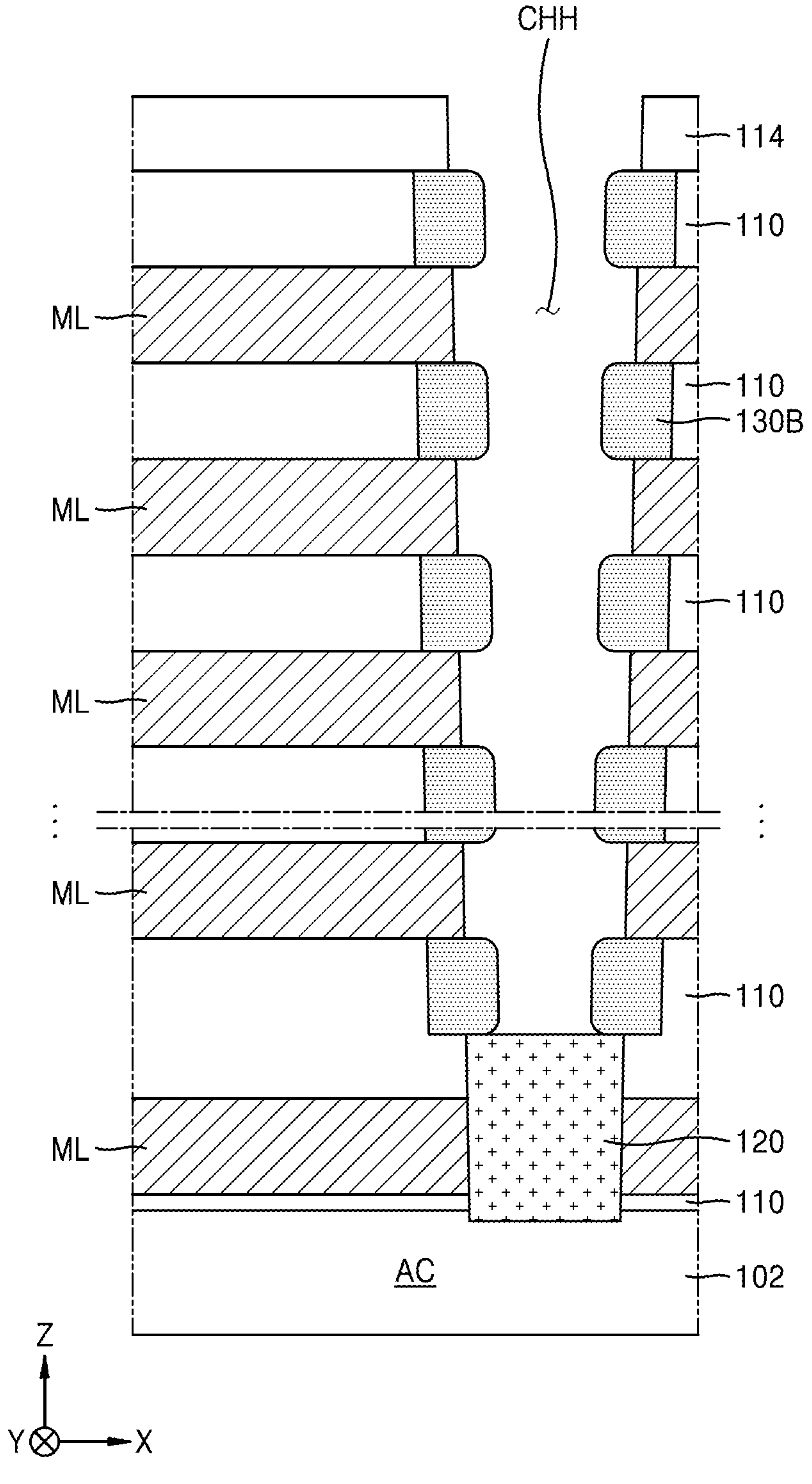
Figure 11G:
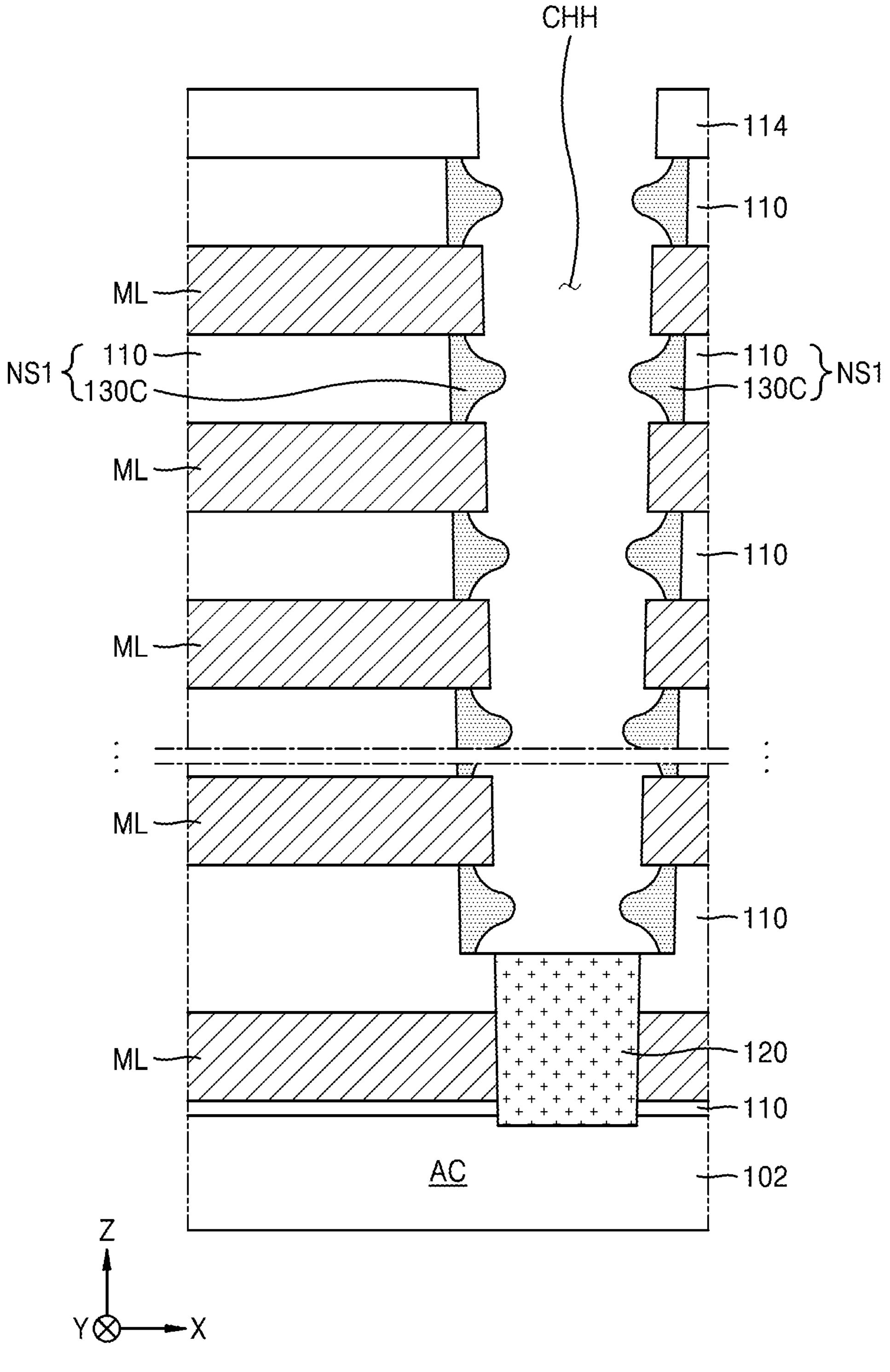
Figure 11H:
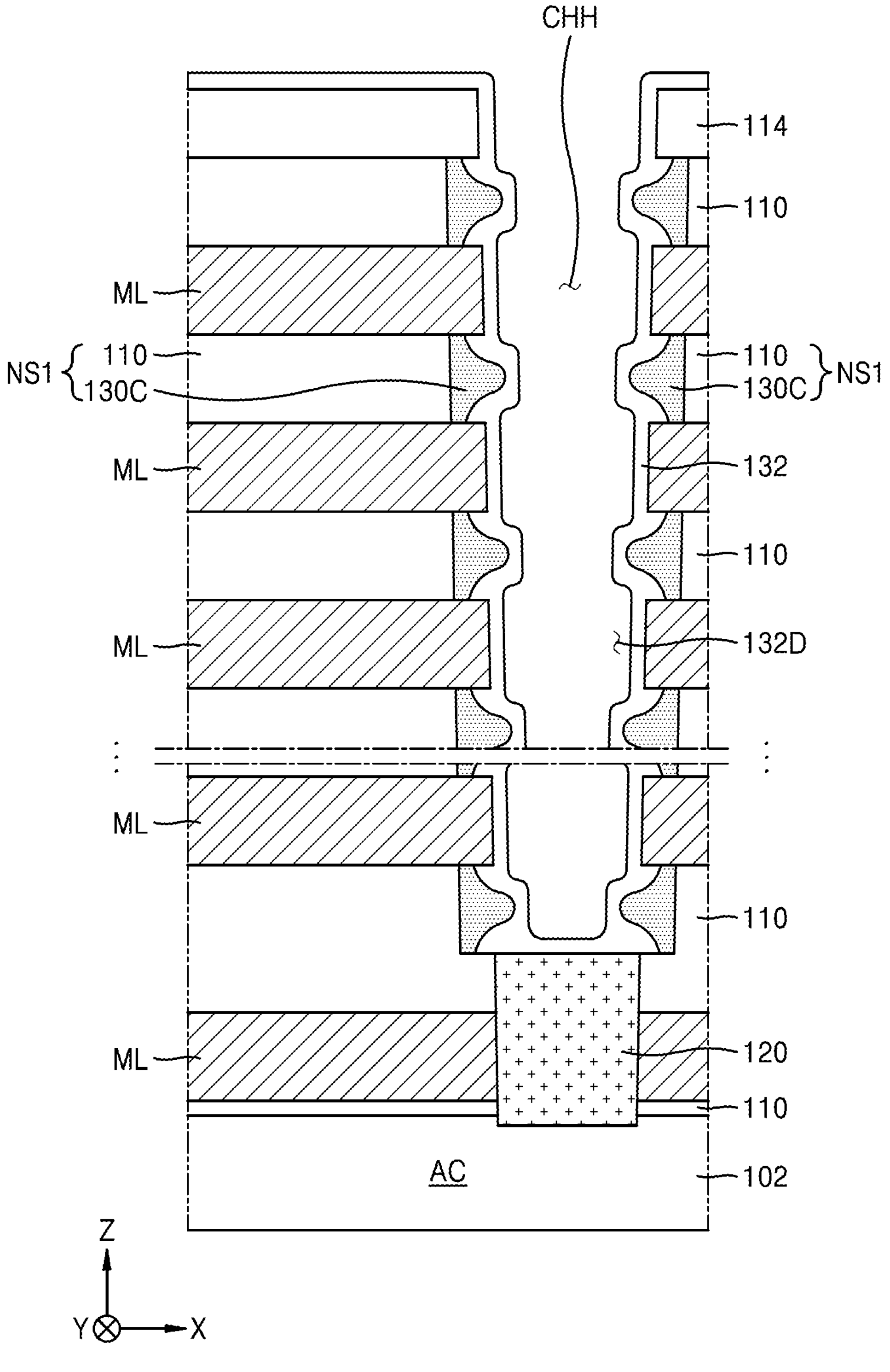
Figure 11I:
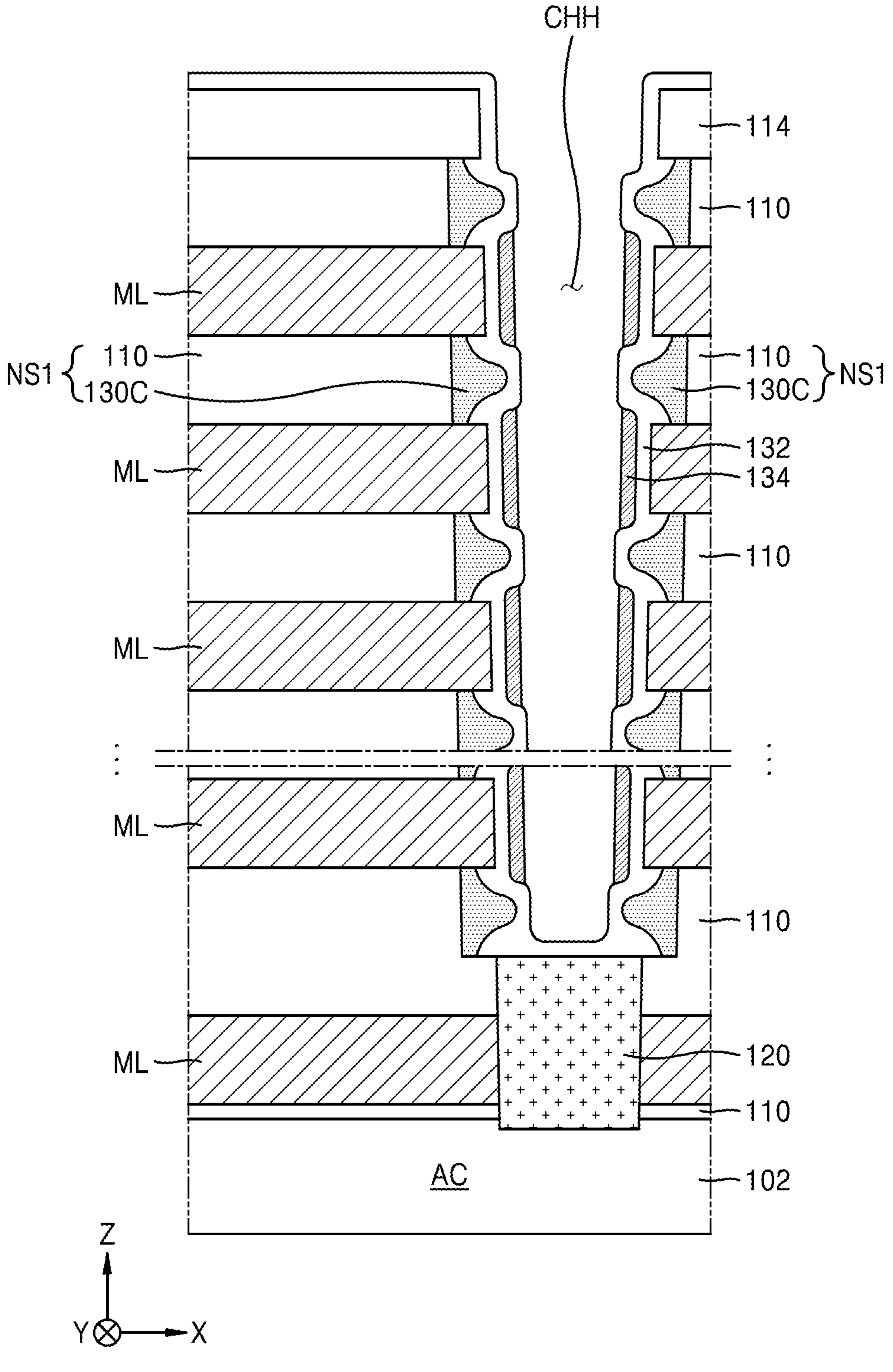
Figure 11J:
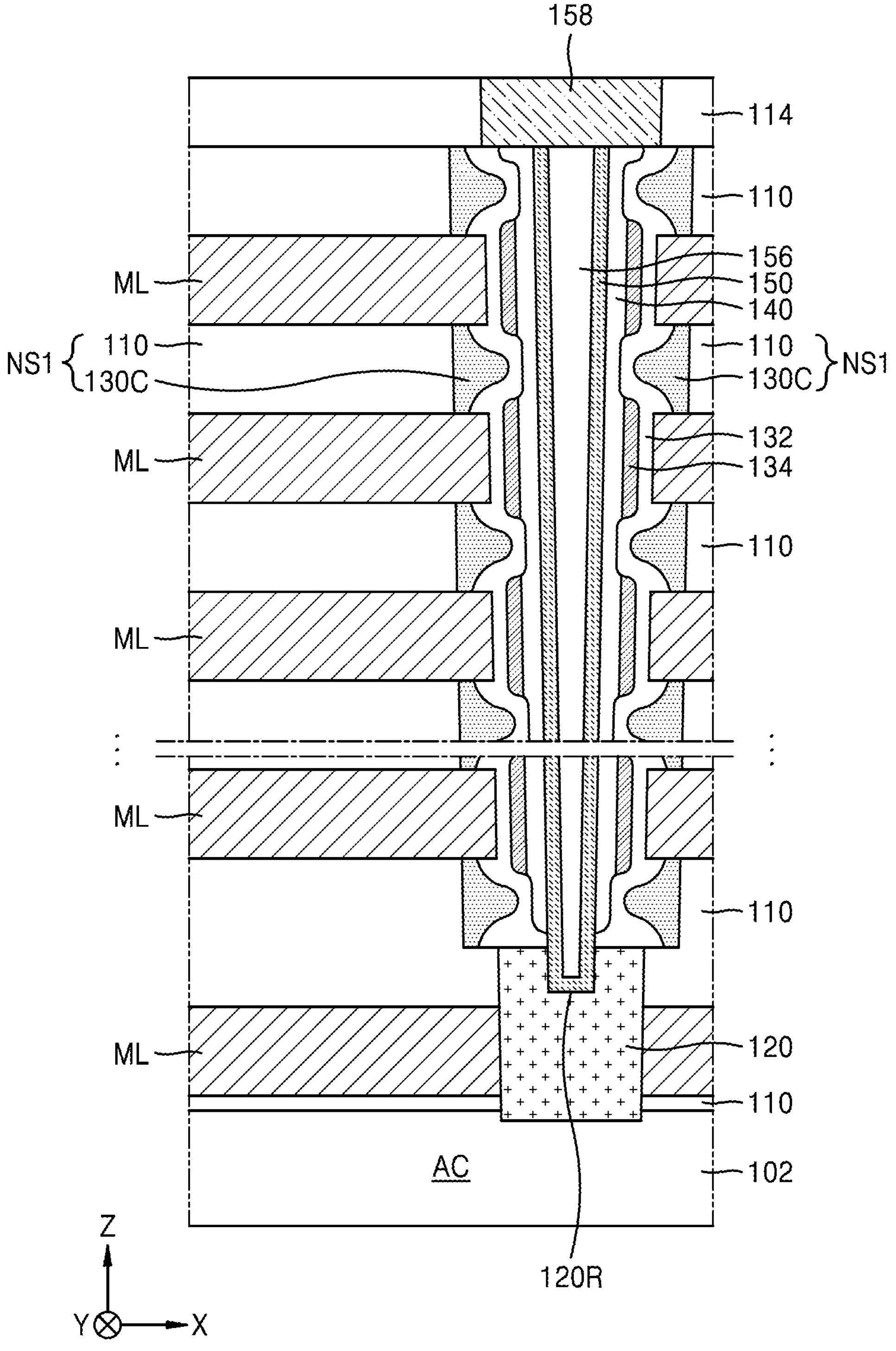
Figure 11K:
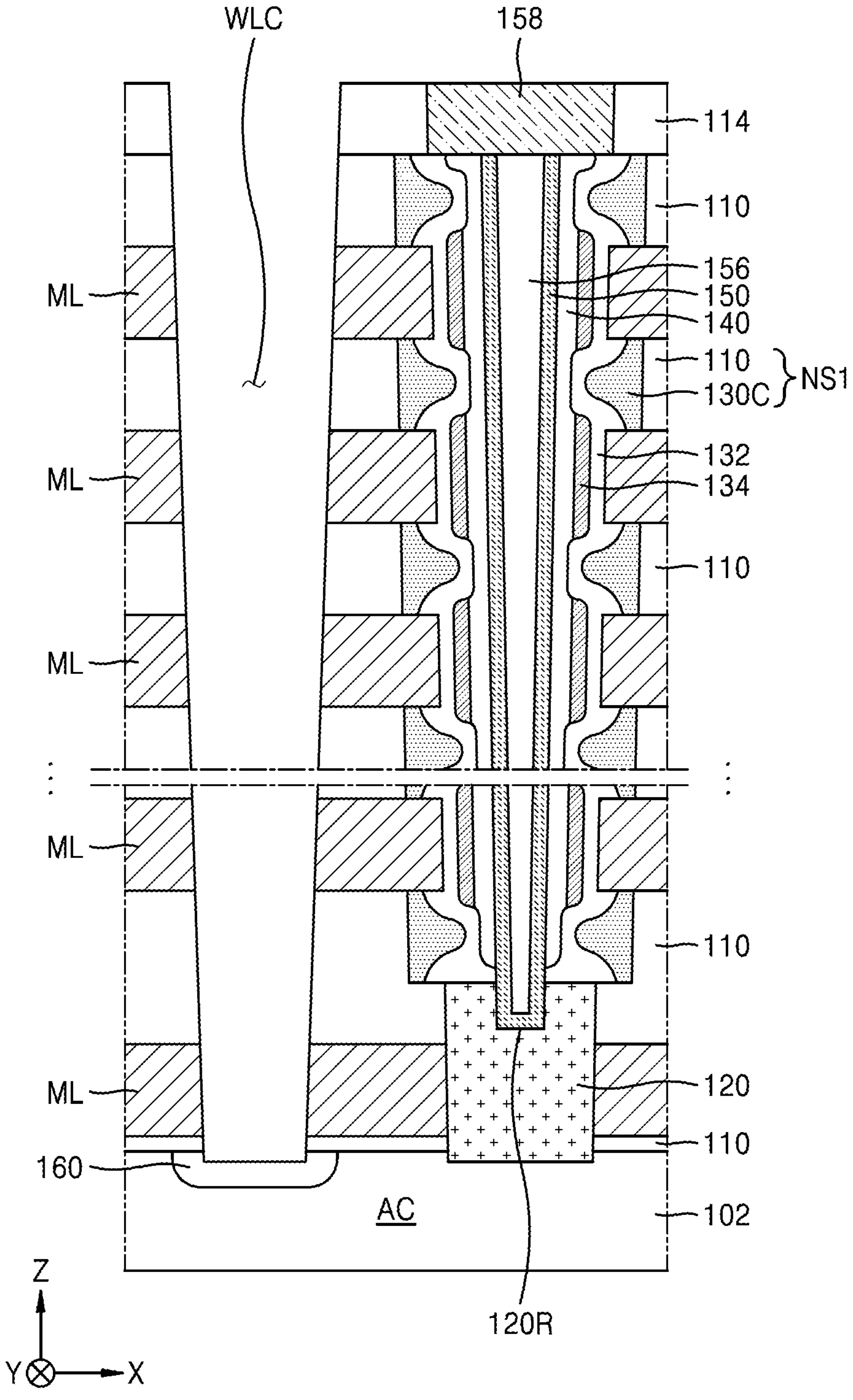
Figure 11L:
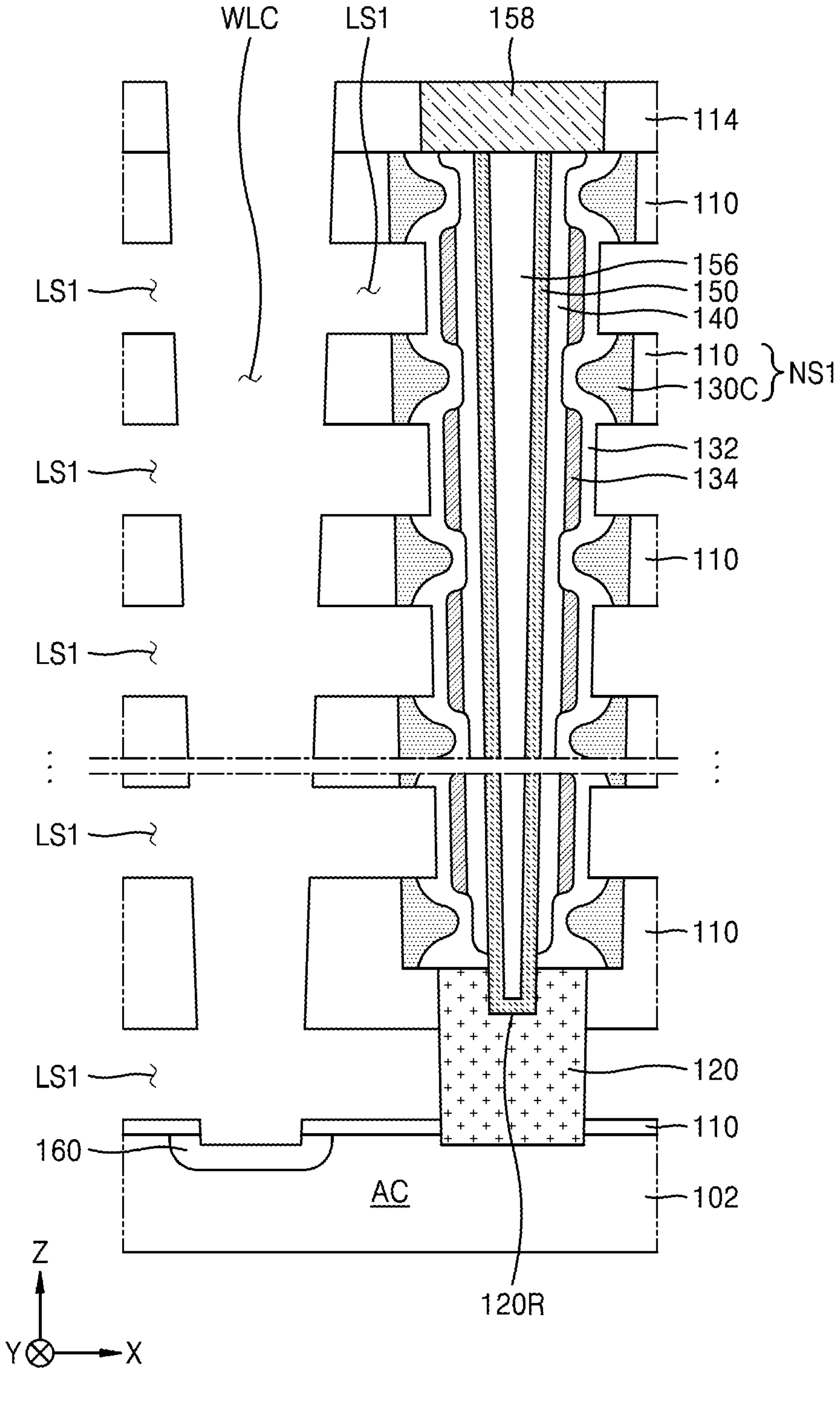
Figure 11M:
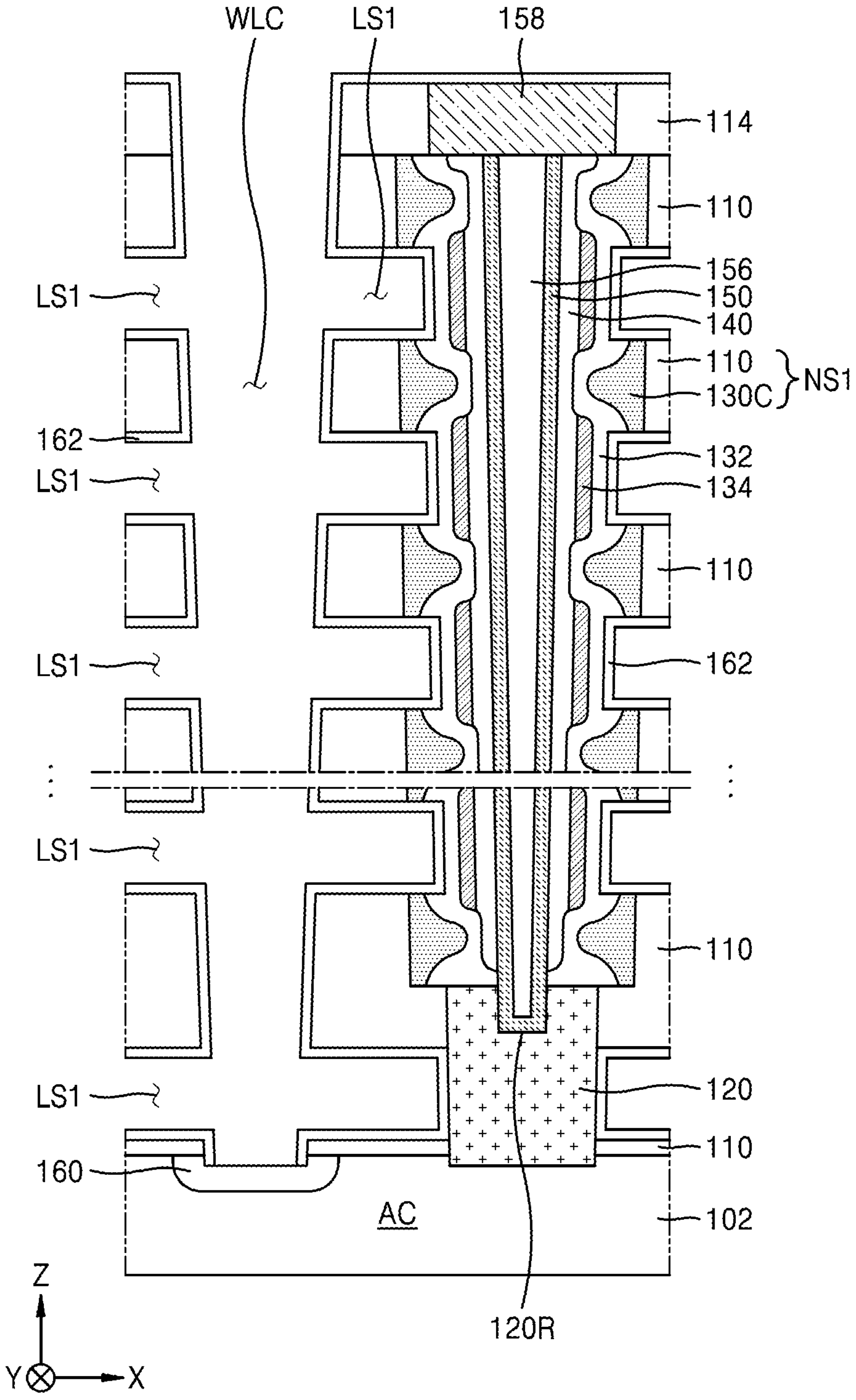
Figure 11N:
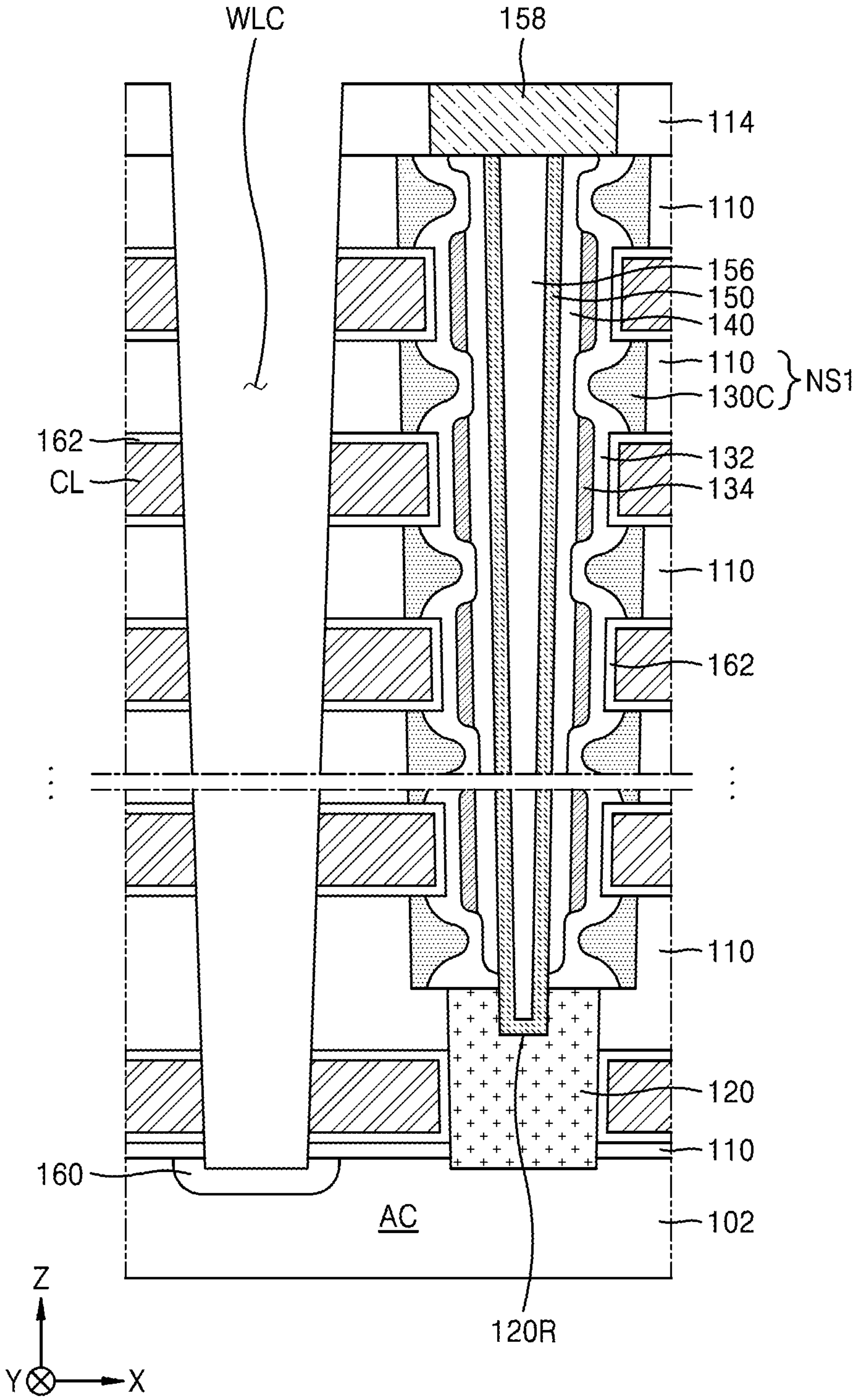
Figure 11O:
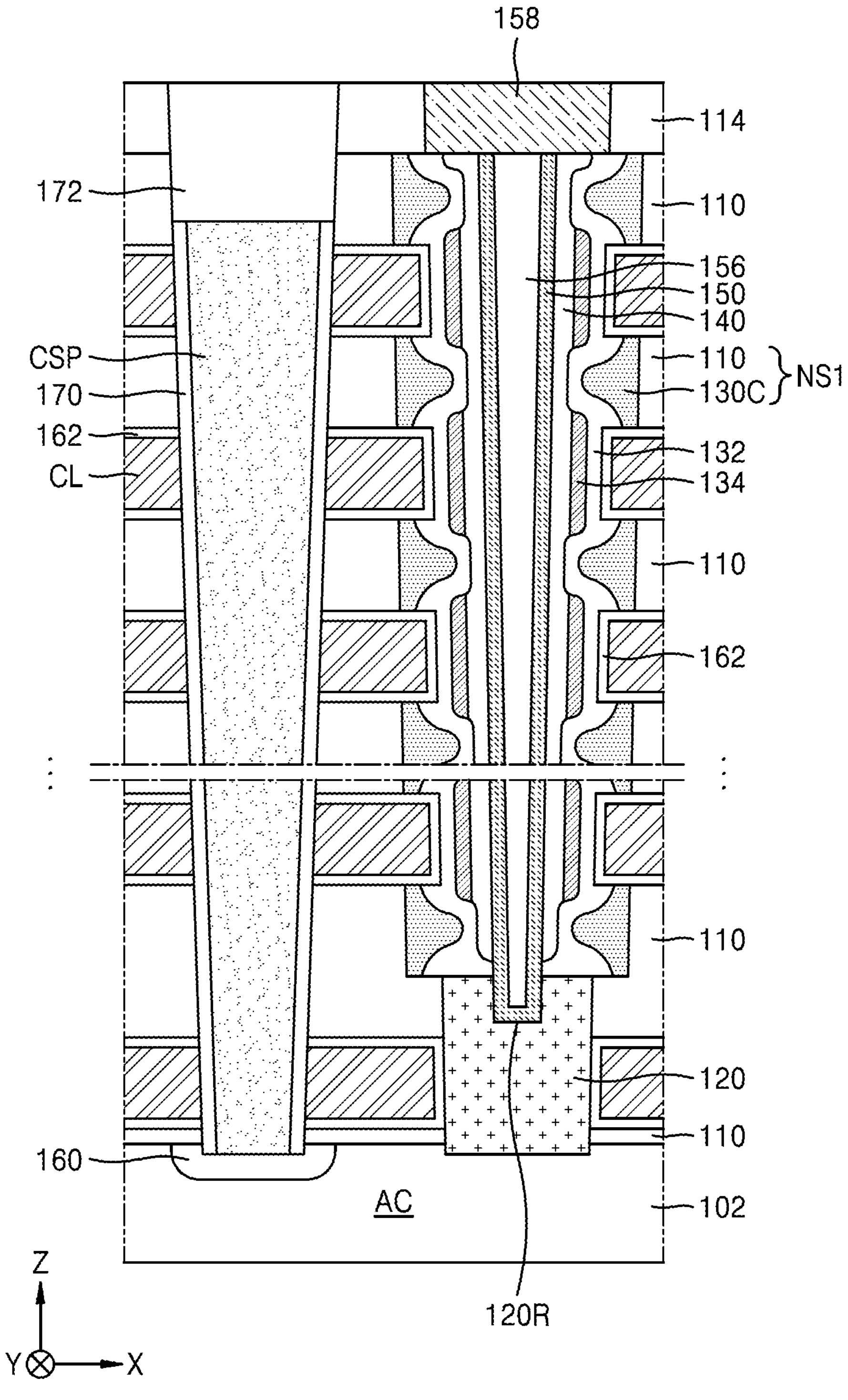

FIGS. 11A to 11O are cross-sectional views of a process sequence of a method of manufacturing a semiconductor device, according to embodiments. In the present embodiment, an example of a method of manufacturing the semiconductor device 100 described with reference to FIGS. 3 and 4 will be described. FIGS. 11A to 11O illustrate enlarged cross-sectional configurations of a portion corresponding to a dashed region Q1 of FIG. 3, according to a process sequence.

Referring to FIG. 11A, an active area AC may be defined in a substrate 102, and a plurality of insulating films P110 and a plurality of mold films ML may be alternately stacked one-by-one on the substrate 102. A lowermost one of the plurality of insulating films P110, which is in contact with the substrate 102, may have a thickness D1 that is less than thicknesses of other insulating films P110. The plurality of insulating films P110 may include a silicon oxide film, and the plurality of mold films ML may include a silicon nitride film.

Each of the plurality of mold films ML may serve as a space for forming a ground selection line GSL, the plurality of word lines WL, and a plurality of string selection lines SSL in a subsequent process. A lowermost one of the plurality of mold films ML, which is closest to the substrate 102, may provide a space for forming the ground selection line GSL. The insulating film P110, which is in contact with a top surface of the lowermost one of the plurality of insulating films P110, may have a thickness D2 greater than thicknesses of other insulating films P110. The plurality of insulating films P110 and the plurality of mold films ML may be each formed by using a chemical vapor deposition (CVD) process, a plasma-enhanced CVD (PECVD) process, or an atomic layer deposition (ALD) process.

Referring to FIG. 11B, a hard insulating film 114 may be formed on an uppermost one of the plurality of insulating films P110. Thereafter, the plurality of insulating films P110 and the plurality of mold films ML may be anisotropically etched by using the hard insulating film 114 as an etch mask, and thus, a channel hole CHH exposing the substrate 102 may be formed.

A width of the channel hole CHH in a lateral direction may be reduced toward the substrate 102. The hard insulating film 114 may include a single layer including an oxide film, a nitride film, or a combination thereof or a multilayered structure.

Referring to FIG. 11C, a selective epitaxial growth (SEG) process may be performed from the bottom of the channel hole CHH, and thus, a semiconductor pattern 120 partially filling the channel hole CHH may be formed. The semiconductor pattern 120 may include a doped semiconductor layer (e.g., a doped silicon (Si) layer or a doped germanium (Ge) layer).

By selectively trimming respective portions of the plurality of insulating films P110 from sidewalls of the plurality of insulating films (refer to P110 in FIG. 11B) exposed through the channel hole CHH, a plurality of recess regions 110R, which are connected to the channel hole CHH, may be respectively formed between the plurality of mold films ML. As a result, a plurality of first insulating patterns 110 may be obtained from the plurality of insulating films P110. In a lateral direction (e.g., X direction of FIG. 11C), a width RW1 of each of the plurality of recess regions 110R (relative to an edge or sidewall or boundary of the channel hole CHH, which may be coplanar with sidewalls of the mold films ML) may be in a range of about 3 nm to about 15 nm, without being limited thereto.

To selectively trim a portion of each of the plurality of insulating films P110, from among the plurality of mold films ML and the plurality of insulating films P110, an etching process of selectively wet etching the plurality of insulating films P110 may be used. For example, when the plurality of mold films ML include a silicon nitride film and the plurality of insulating films P110 include a silicon oxide film, a hydrofluoric acid-based solution (e.g. an HF solution) may be used to selectively trim a portion of each of the plurality of insulating films P110, without being limited thereto. In embodiments, the process of trimming the plurality of insulating films P110 may be performed while the semiconductor pattern 120 is being covered with a protective film (not shown).

Referring to FIG. 11D, a doped polysilicon film 130 may be formed to cover the exposed surfaces of the resultant structure of FIG. 11C. The doped polysilicon film 130 may be formed to such a sufficient thickness as to fill the plurality of recess regions 110R.

In embodiments, the doped polysilicon film 130 may include a polysilicon film including a dopant, which includes a carbon (C) atom, a nitrogen (N) atom, a boron (B) atom, a fluorine (F) atom, or a combination thereof.

Referring to FIG. 11E, in the resultant structure of FIG. 11D, the doped polysilicon film 130 may be trimmed. Thus, a sidewall of each of the plurality of mold films ML may be exposed inside the channel hole CHH, and a plurality of doped polysilicon patterns 130A including portions of the doped polysilicon film 130, which remain inside the plurality of recess regions 110R, may be formed. In embodiments, the doped polysilicon film 130 may be trimmed by using a wet etching process.

Referring to FIG. 11F, the resultant structure of FIG. 11D, in which the plurality of doped polysilicon patterns 130A are exposed, may be processed in an oxidizing atmosphere or a nitriding atmosphere. Thus, a plurality of expanded insulating patterns 130B may be formed from the plurality of doped polysilicon patterns 130A.

While the resultant structure in which the plurality of doped polysilicon patterns 130A are exposed is being processed in an oxidizing atmosphere or a nitriding atmosphere, partial regions of the plurality of first insulating patterns 110, which are in contact with the plurality of doped polysilicon patterns 130A, may also be oxidized or nitrided together with the plurality of doped polysilicon patterns 130A. Thus, a width of each of the plurality of first insulating patterns 110 in the lateral direction (e.g., X direction) may be reduced.

In embodiments, when a plurality of doped polysilicon films 130 include a polysilicon film doped with a carbon atom (C), the resultant structure in which the plurality of doped polysilicon films 130 are exposed may be processed in an oxidizing atmosphere in the process described with reference to FIG. 11F. In this case, the plurality of doped polysilicon films 130 may be oxidized, and thus, a plurality of expanded insulating patterns 130B including SiOC may be obtained.

In other embodiments, when the plurality of doped polysilicon films 130 include a polysilicon film doped with a carbon atom (C) and a nitrogen atom (N), the resultant structure in which the plurality of doped polysilicon films 130 are exposed may be processed in an oxidizing atmosphere in the process described with reference to FIG. 11F. In this case, the plurality of doped polysilicon films 130 may be oxidized, and thus, a plurality of expanded insulating patterns 130B including SiOCN may be obtained.

In still other embodiments, when the plurality of doped polysilicon films 130 include a polysilicon film doped with a boron atom (B), the resultant structure in which the plurality of doped polysilicon films 130 are exposed may be processed in an oxidizing atmosphere in the process described with reference to FIG. 11F. In this case, the plurality of doped polysilicon films 130 may be oxidized, and thus, a plurality of expanded insulating patterns 130B including SiOB may be obtained.

In yet other embodiments, when the plurality of doped polysilicon films 130 include a polysilicon film doped with a boron atom (B), the resultant structure in which the plurality of doped polysilicon films 130 are exposed may be processed in a nitriding atmosphere in the process described with reference to FIG. 11F. In this case, the plurality of doped polysilicon films 130 may be nitrided, and thus, a plurality of expanded insulating patterns 130B including SiBN may be obtained.

In further other embodiments, when the plurality of doped polysilicon films 130 include a polysilicon film doped with a fluorine atom (F), the resultant structure in which the plurality of doped polysilicon films 130 are exposed may be processed in an oxidizing atmosphere in the process described with reference to FIG. 11F. In this case, the plurality of doped polysilicon films 130 may be oxidized, and thus, a plurality of expanded insulating patterns 130B including SiOF may be obtained.

Referring to FIG. 11G, the plurality of expanded insulating patterns 130B may be trimmed in the resultant structure of FIG. 11F. Thus, of the plurality of expanded insulating patterns 130B, portions inside the channel hole CHH and portions in entrance regions of the plurality of recess regions 110R, which are adjacent to the channel hole CHH, may be reduced in thickness in a vertical direction (Z direction). As a result, a plurality of second insulating patterns 130C may be obtained from the plurality of expanded insulating patterns 130B. Each of the plurality of second insulating patterns 130C may include a portion that laterally protrudes into the channel hole CHH, where an edge or boundary of the channel hole CHH may be defined by sidewalls of the mold films ML (or the conductive patterns CL and liner 162 that replace the mold films ML). The plurality of expanded insulating patterns 130B may be trimmed by using a wet etching process.

Referring to FIG. 11H, in the resultant structure of FIG. 11G, a blocking dielectric film 132 may be formed to conformally cover exposed surfaces inside the channel hole CHH. Because a portion of each of the plurality of second insulating patterns 130C protrudes into the channel hole CHH (e.g., laterally beyond the sidewall of the mold films ML or the conductive patterns CL/liner 162), portions of the blocking dielectric film 132, which cover the plurality of second insulating patterns 130C, may protrude more into the channel CHH than portions of the blocking dielectric film 132, which cover the plurality of mold films ML. On a surface of the blocking dielectric film 132, which faces the inside of the channel hole CHH, a plurality of indent spaces 132D facing the sidewalls of the plurality of mold films ML may be formed between two second insulating patterns 130C, which are adjacent to each other in the vertical direction (Z direction).

Referring to FIG. 11I, in the resultant structure of FIG. 11H, a plurality of charge trap patterns 134 filling the plurality of indent spaces 132D may be formed on the blocking dielectric film 132.

To form the plurality of charge trap patterns 134, a preliminary charge trap film may be formed to conformally cover the blocking dielectric film 132 in the resultant structure of FIG. 11H. Thereafter, a process of trimming the preliminary charge trap film may be performed such that the preliminary charge trap film remains only in the plurality of indent spaces (refer to 132D in FIG. 11H).

Referring to FIG. 11J, a tunneling dielectric film 140, a channel film 150, and a buried insulating film 156 may be sequentially formed to sequentially cover the blocking dielectric film 132 and the plurality of charge trap patterns 134, which are exposed inside the channel hole CHH, and a drain region 158 may be formed to fill an upper portion adjacent to an entrance of the channel hole CHH.

Inside the channel hole CHH, each of the tunneling dielectric film 140 and the channel film 150 may have a cylindrical shape. During the formation of the tunneling dielectric film 140 and the channel film 150, a partial region of a top surface of the semiconductor pattern 120 may be removed, and thus, a recess surface 120R may be formed in the top surface of the semiconductor pattern 120. The channel film 150 may be in contact with the recess surface 120R of the semiconductor pattern 120.

To form the tunneling dielectric film 140, the channel film 150, and the buried insulating film 156, a deposition process and an etchback process may be performed plural times. The deposition process may be performed by using a CVD process, a low-pressure CVD (LPCVD) process, or an ALD process.

Referring to FIG. 11K, the hard insulating film 114, the plurality of first insulating patterns 110, and the plurality of mold films ML may be anisotropically etched. Thus, a word line cut region WLC may be formed to pass through the hard insulating film 114, the plurality of first insulating patterns 110, and the plurality of mold films ML and expose the substrate 102. Thereafter, impurity ions may be implanted into the substrate 102 through the word line cut region WLC to form a common source region 160.

Referring to FIG. 11L, a plurality of spaces LS1 may be formed by removing the plurality of mold films ML through the word line cut region WLC. Portions of the blocking dielectric film 132 may be exposed through the plurality of spaces LS1.

Referring to FIG. 11M, a blocking dielectric liner 162 may be formed on the resultant structure of FIG. 11L. The blocking dielectric liner 162 may be formed to conformally cover surfaces that are exposed through the space LS1 and the word line cut region WLC. The blocking dielectric liner 162 may be formed by using an ALD process, a CVD process, or a plasma oxidation process.

Referring to FIG. 11N, a plurality of conductive patterns CL may be formed to fill spaces defined by the blocking dielectric liner 162 in the plurality of spaces (refer to LS1 in FIG. 11M). To this end, spaces of the plurality of spaces LS1, which are defined by the blocking dielectric liner 162, may be filled with a conductive layer through the plurality of word line cut regions WLC. The conductive layer may include a metal (e.g., tungsten (W)). A sidewall, a bottom surface, and a top surface of the conductive pattern CL may be covered by the blocking dielectric liner 162 in the space LS1.

Referring to FIG. 11O, an insulating spacer 170, a common source pattern CSP, and a capping insulating film 172 may be formed in the word line cut region WLC.

In embodiments, to form the insulating spacer 170 in the word line cut region WLC, firstly, a spacer insulating film may be formed to cover an inner sidewall of the word line cut region WLC. Thereafter, the spacer insulating film may be etched back to expose the common source region 160 at a bottom surface of the word line cut region WLC, and thus, the insulating spacer 170 may remain on the inner sidewall of the word line cut region WLC.

To form the common source pattern CSP, a conductive layer may be formed inside and outside the word line cut region WLC such that a space defined by the insulating spacer 170 is filled with a conductive material in the word line cut region WLC. Afterwards, unnecessary portions of the conductive layer may be removed by using a chemical mechanical polishing (CMP) process or an etchback process.

To form the capping insulating film 172, an insulating film filling the remaining space of the word line cut region WLC may be formed on the resultant structure including the insulating spacer 170 and the common source pattern CSP. Next, a portion of the insulating film may be removed by using a CHIP process or an etchback process to expose a top surface of the hard insulating film 114 and a top surface of the drain region 158.

Afterwards, as shown in FIGS. 3 and 4, an upper insulating film 180 may be formed to cover the hard insulating film 114, the drain region 158, and the capping insulating film 172. A portion of the upper insulating film 180, a portion of the hard insulating film 114, a portion of the first insulating pattern 110, two upper ones of the plurality of conductive patterns CL, and portions of the blocking dielectric liner 162 respectively surrounding the two upper ones of the plurality of plurality of conductive patterns CL may be removed to form a string selection line cut region (refer to SCL in FIG. 3). The string selection line cut region SCL may be filled with an insulating film 184.

Thereafter, a plurality of bit line contact holes may be formed to pass through the upper insulating film 180. The plurality of bit line contact holes may be filled with a conductive material to form a plurality of bit line contact pads 182. A plurality of bit lines BL, which are connected to the plurality of bit line contact pads 182, may be formed on the upper insulating film 180. Thus, the semiconductor device 100 shown in FIGS. 3 and 4 may be manufactured.

Figure 12A:
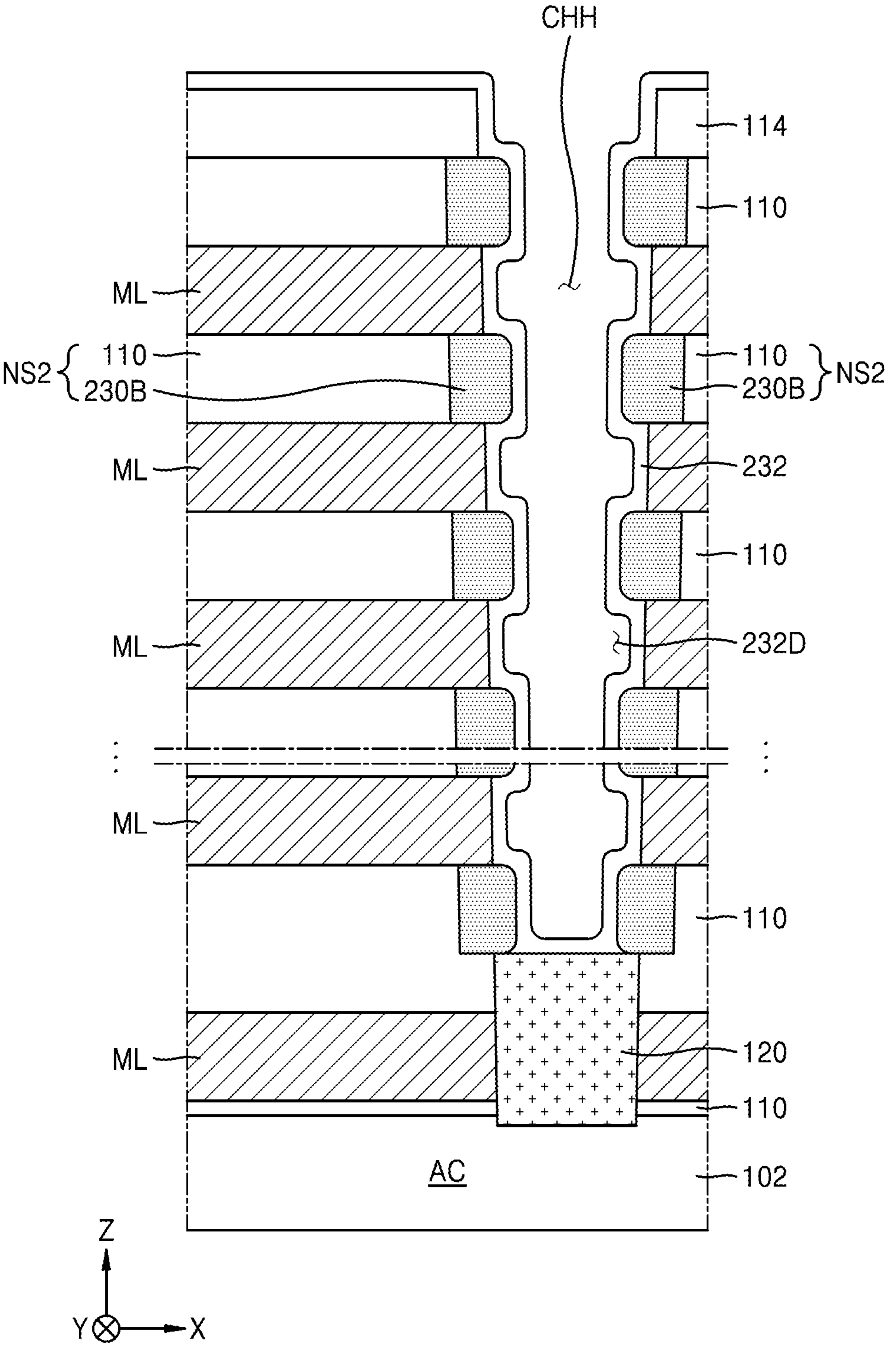
FIGS. 12A, 12B, and 12C are cross-sectional views of a process sequence of a method of manufacturing a semiconductor device, according to embodiments.
Figure 12B:
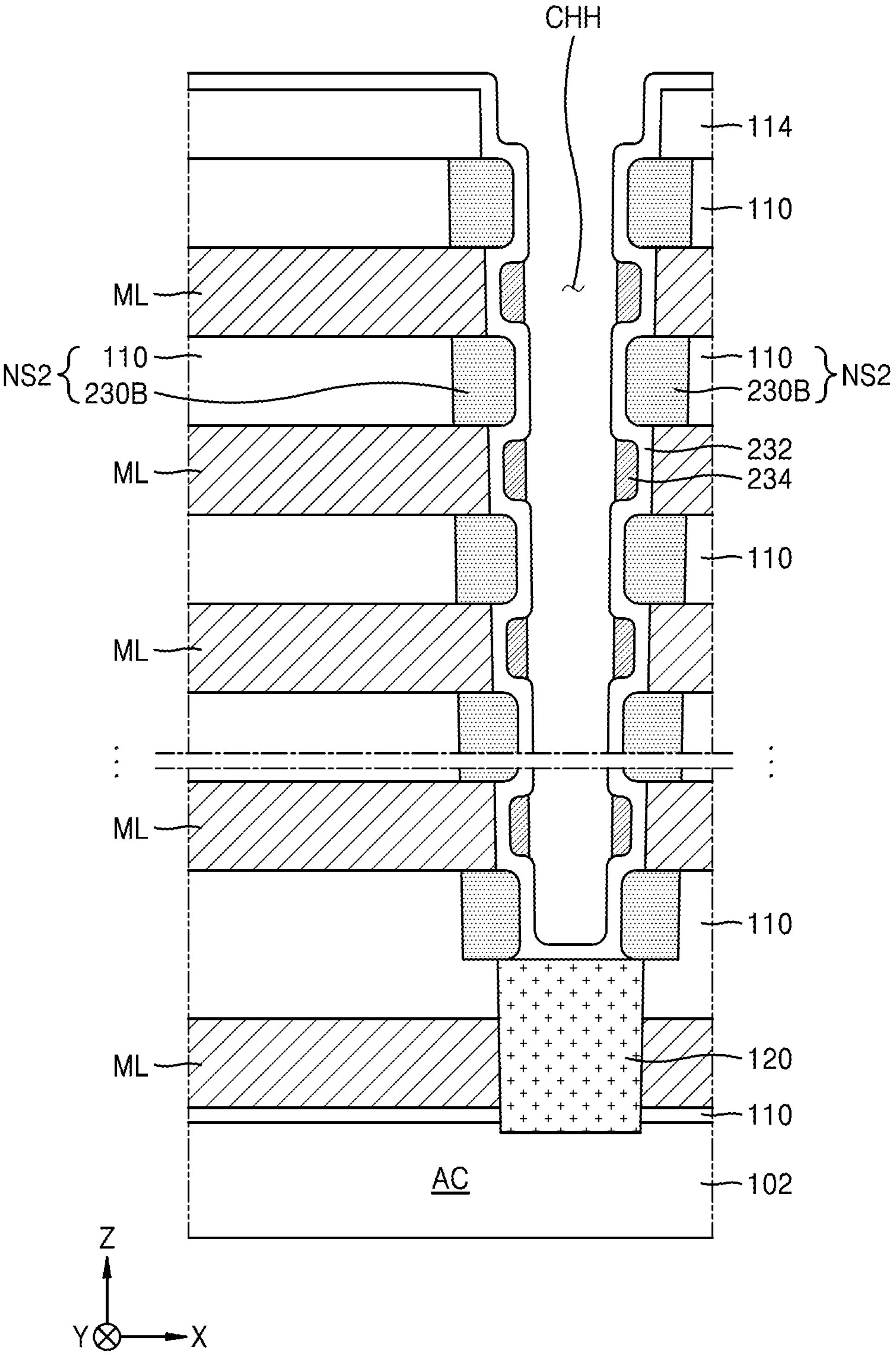
Figure 12C:
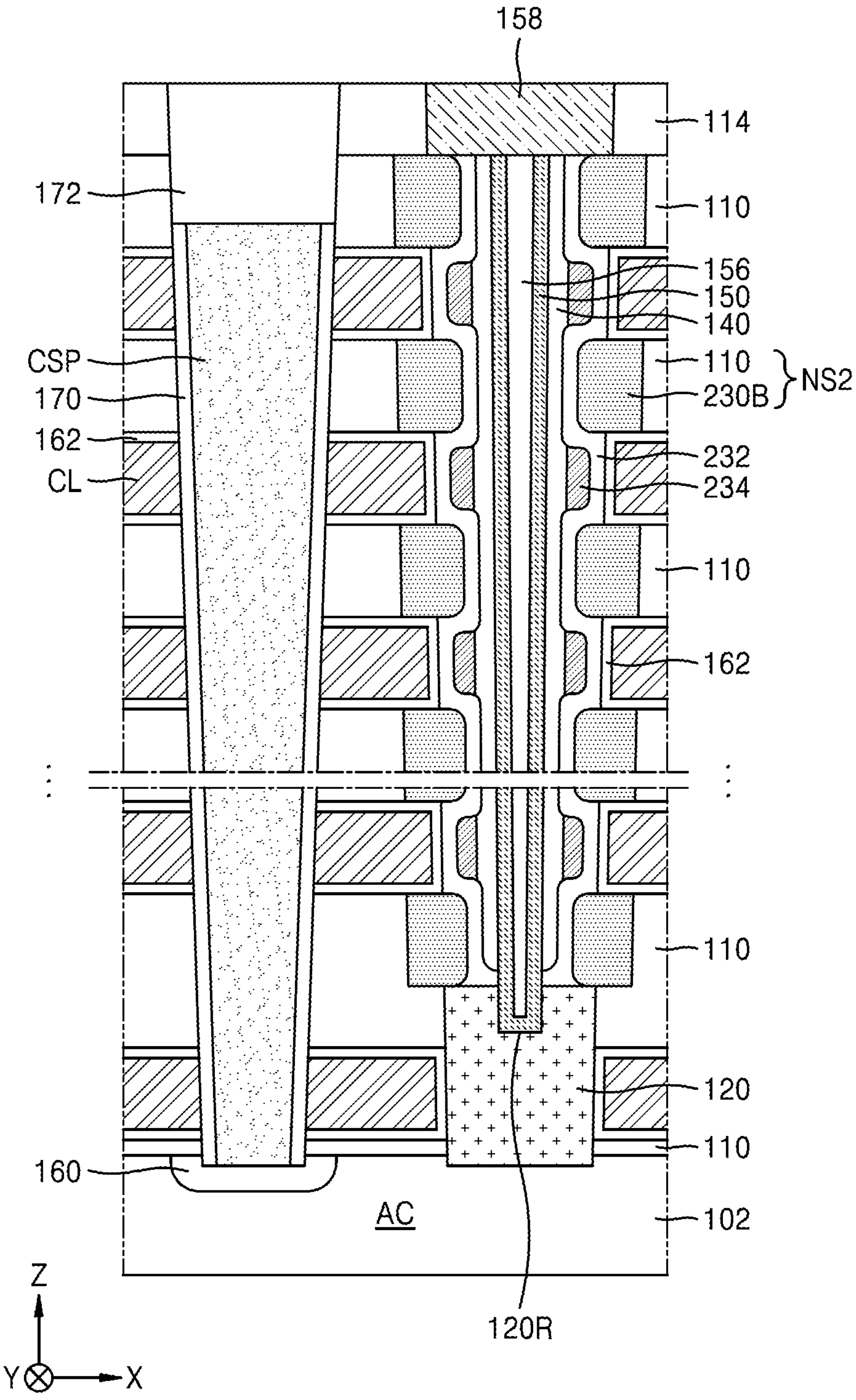

FIGS. 12A to 12C are cross-sectional views of a process sequence of a method of manufacturing a semiconductor device, according to embodiments. In the present embodiment, an example of a method of manufacturing the semiconductor device 200 described with reference to FIGS. 5 and 6 will be described. FIGS. 12A to 12C illustrate enlarged cross-sectional configurations of a portion corresponding to a dashed region Q2 of FIG. 5, according to a process sequence. In FIGS. 12A to 12C, the same reference numerals are used to denote the same elements as in FIGS. 5 and 6, and thus, repeated descriptions thereof will be omitted.

Referring to FIG. 12A, the processes described with reference to FIGS. 11A to 11F may be performed up to forming a plurality of expanded insulating patterns 130B. The plurality of expanded insulating patterns (refer to 130B in FIG. 11F) may constitute a plurality of second insulating patterns 230B shown in FIGS. 5 and 6.

Thereafter, by using a method similar to the process of forming the blocking dielectric film 132 described with reference to FIG. 11H, a blocking dielectric film 232 may be formed to conformally cover exposed surfaces in a channel hole CHH in the resultant structure of FIG. 12A. Because a portion of each of the plurality of second insulating patterns 230B protrudes into the channel hole CHH, portions of the blocking dielectric film 232, which cover the plurality of second insulating patterns 230B, may protrude more into the channel hole CHH than portions of the blocking dielectric film 232, which cover the plurality of mold films ML. On a surface of the blocking dielectric film 232, which faces the inside of the channel hole CHH, a plurality of indent spaces 232D facing sidewalls of the plurality of mold films ML may be formed between two second insulating patterns 230B, which are adjacent to each other in a vertical direction (Z direction).

Referring to FIG. 12B, by using a method similar to that described with reference to FIG. 11I, a plurality of charge trap patterns 234 filling the plurality of indent spaces 232D may be formed on the blocking dielectric film 232.

Referring to FIG. 12C, the processes described with reference to FIGS. 11J to 11O may be performed on the resultant structure of FIG. 12B, and thus, the semiconductor device 200 shown in FIGS. 5 and 6 may be manufactured.

Although the methods of manufacturing the semiconductor device 100 shown in FIGS. 3 and 4 and the semiconductor device 200 shown in FIGS. 5 and 6 have been described with reference to FIGS. 11A to 11O and 12A to 12C, it will be understood that the semiconductor devices 500 and 500A shown in FIGS. 7 to 10 may be manufactured by applying various modifications and changes to the descriptions of FIGS. 11A to 11O and 12A to 12C within the scope of the inventive concept.

In the methods of manufacturing the semiconductor device according to the inventive concept, even when a distance between cell adjacent to each other in a vertical direction is relatively small inside a channel hole in a vertical memory device, the reliability of the semiconductor device may be improved by inhibiting cell interference due to the diffusion of charges between adjacent cells. Also, the semiconductor device may have a structure capable of reducing an undesired capacitive coupling effect between a plurality of conductive patterns.

Figure 13:
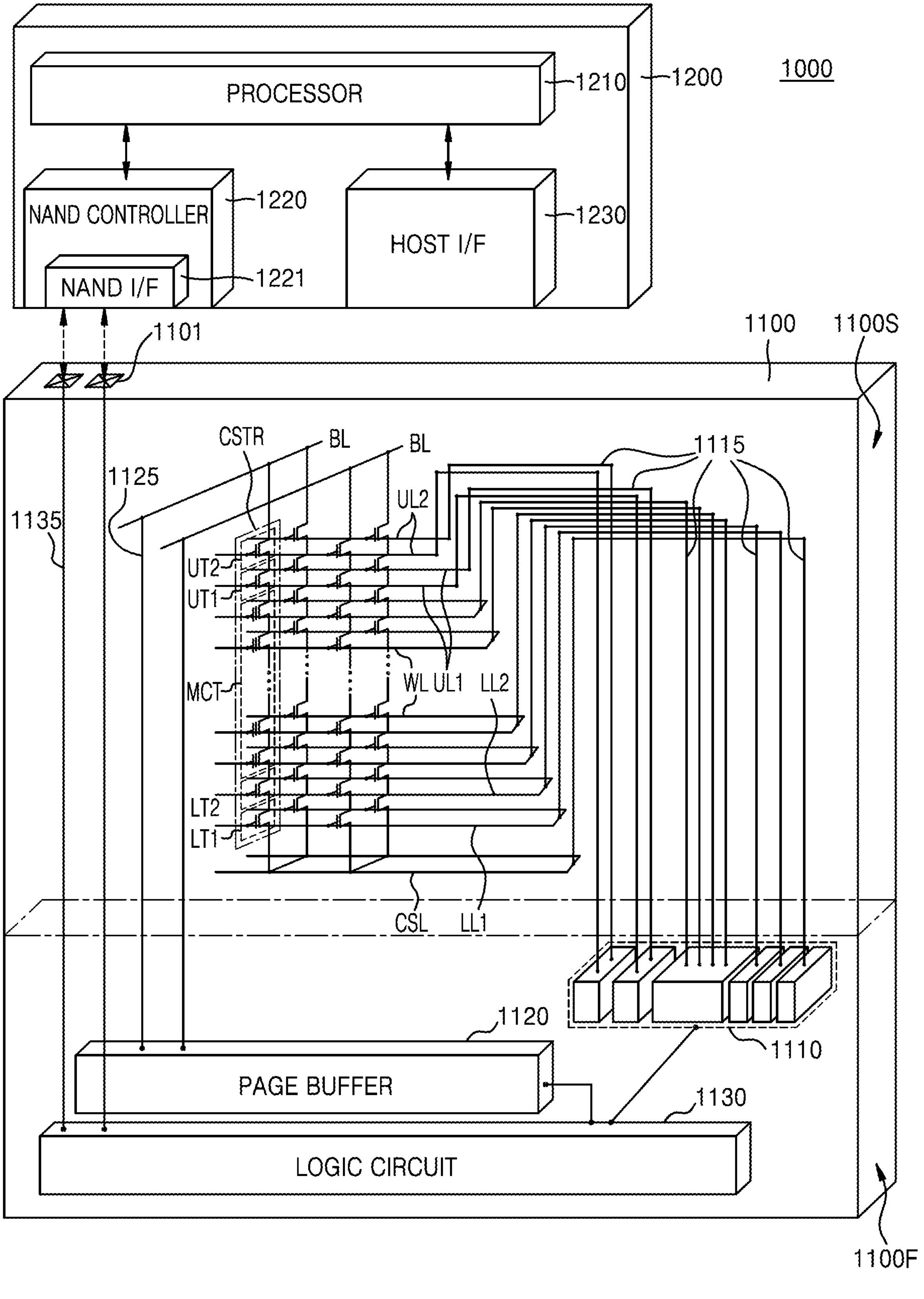
FIG. 13 is a schematic diagram of an electronic system including a semiconductor device, according to embodiments.

FIG. 13 is a schematic diagram of an electronic system 1000 including a semiconductor device, according to embodiments.

Referring to FIG. 13, the electronic system 1000 according to the embodiment may include a semiconductor device 1100 and a controller 1200 electrically connected to the semiconductor device 1100. The electronic system 1000 may be a storage device including at least one semiconductor device 1100 or an electronic device including the storage device. For example, the electronic system 1000 may include a solid-state drive (SSD) device, a universal serial bus (USB), a computing system, a medical device, or a communication device, which includes the at least one semiconductor device 1100.

The semiconductor device 1100 may include a non-volatile memory device. For example, the semiconductor device 1100 may include a NAND flash memory device including at least one of the structures of the semiconductor devices 100, 200, 500, and 500A that have been described with reference to FIGS. 2 to 10. The semiconductor device 1100 may include a first structure 1100F and a second structure 1100S on the first structure 1100F. In embodiments, the first structure 1100F may be beside the second structure 1100S. The first structure 1100F may include a peripheral circuit structure including a decoder circuit 1110, a page buffer 1120, and a logic circuit 1130. The second structure 1100S may be a memory cell structure including a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, each of the plurality of memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors (e.g., LT1 and LT2) and the number of upper transistors (e.g., UT1 and UT2) may be variously changed according to embodiments.

In embodiments, the upper transistors UT1 and UT2 may include a string selection transistor, and the lower transistors LT1 and LT2 may include a ground selection transistor. The first and second gate lower lines LL1 and LL2 may be respectively gate electrodes of the lower transistors LT1 and LT2. The word line WL may be a gate electrode of the memory cell transistor MCT, and the first and second gate upper lines UL1 and UL2 may be gate electrodes of the upper transistors UT1 and UT2.

The common source line CSL, the first and second gate lower lines LL1 and LL2, the plurality of word lines WL, and the first and second gate upper lines UL1 and UL2 may be electrically connected to the decoder circuit 1110 through a plurality of first connecting wires 1115, which extend to the second structure 1100S in the first structure 1100F. The plurality of bit lines BL may be electrically connected to the page buffer 1120 through a plurality of second connecting wirings 1125, which extend to the second structure 1100S in the first structure 1100F.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The semiconductor device 1100 may communicate with the controller 1200 through an I/O pad 1101 that is electrically connected to the logic circuit 1130. The I/O pad 1101 may be electrically connected to the logic circuit 1130 through I/O connection wirings 1135, which extend to the second structure 1100S in the first structure 1100F.

The controller 1200 may include a processor 1210, a NAND controller 1220, and a host interface (or host I/F) 1230. In some embodiments, the electronic system 1000 may include a plurality of semiconductor devices 1100. In this case, the controller 1200 may control the plurality of semiconductor devices 1100.

The processor 1210 may control all operations of the electronic system 1000 including the controller 1200. The processor 1210 may operate according to predetermined firmware and may access the semiconductor device 1100 by controlling the NAND controller 1220. The NAND controller 1220 may include a NAND interface (or NAND I/F) 1221 configured to process communication with the semiconductor device 1100. A control command for controlling the semiconductor device 1100, data to be written to the plurality of memory cell transistors MCT of the semiconductor device 1100, and data to be read from the plurality of memory cell transistors MCT of the semiconductor device 1100 may be transmitted through the NAND interface 1221. The host interface 1230 may provide a communication function between the electronic system 1000 and an external host. When receiving the control command from the external host through the host interface 1230, the processor 1210 may control the semiconductor device 1100 in response to the control command.

Figure 14:
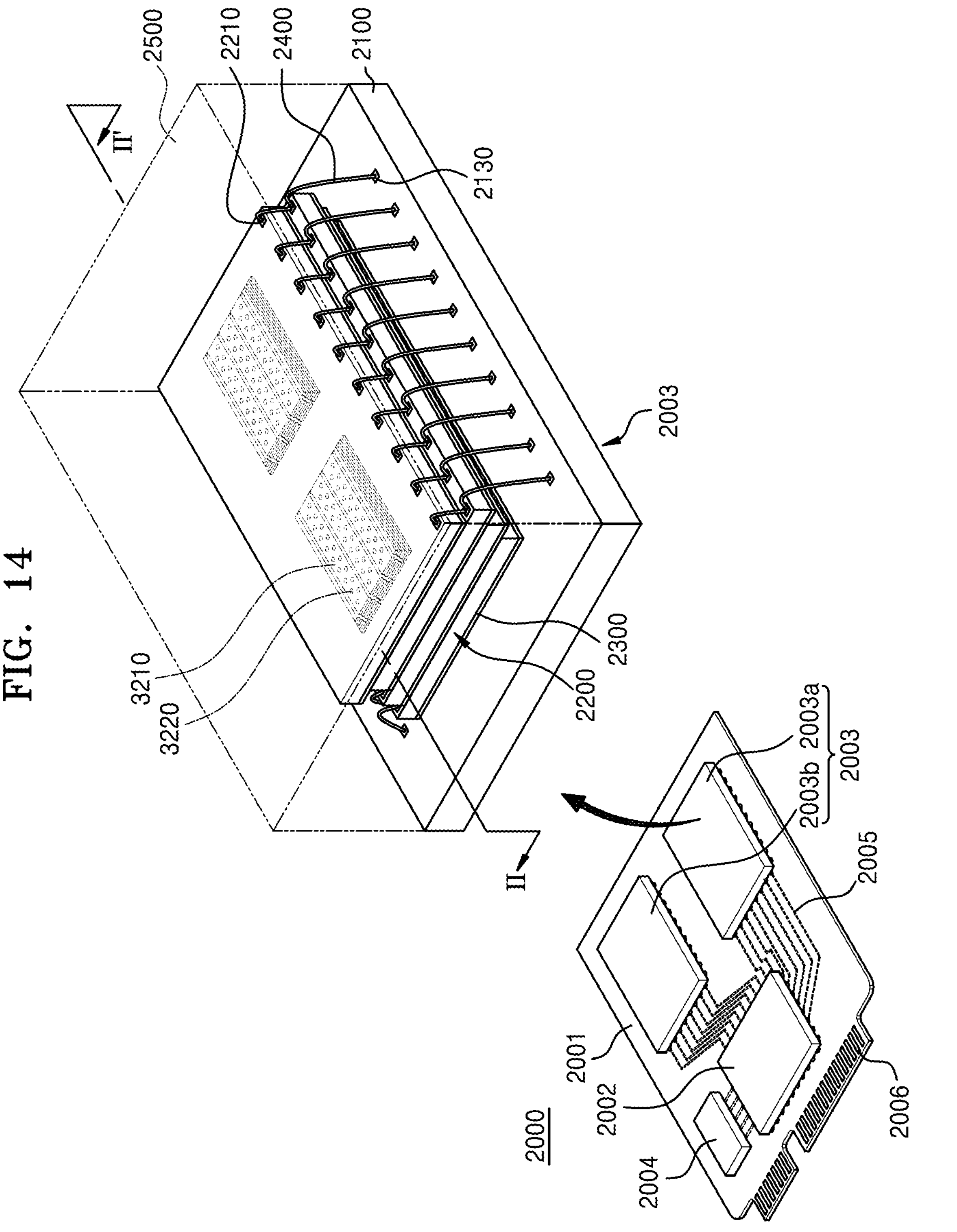
FIG. 14 is a perspective view of an electronic system including a semiconductor device, according to embodiments.

FIG. 14 is a perspective view of an electronic system 2000 including a semiconductor device, according to embodiments.

Referring to FIG. 14, the electronic system 2000 according to the embodiments may include a main substrate 2001, a controller 2002 mounted on the main substrate 2001, at least one semiconductor package 2003, and DRAM 2004. The semiconductor package 2003 and the DRAM 2004 may be connected to the controller 2002 by a plurality of wiring patterns 2005 formed in the main substrate 2001.

The main substrate 2001 may include a connector 2006 including a plurality of pins that are combined with an external host. In the connector 2006, the number and arrangement of pins may depend on a communication interface between the electronic system 2000 and the external host. In example embodiments, the electronic system 2000 may communicate with the external host by using any one of interfaces, such as a USB, peripheral component interconnect-express (PCI-E), serial advanced technology attachment (SATA), and M-Phy for universal flash storage (UFS). In example embodiments, the electronic system 2000 may operate by power received from the external host through the connector 2006. The electronic system 2000 may further include a power management integrated circuit (PMIC) configured to divide power supplied from the external host into the controller 2002 and the semiconductor package 2003.

The controller 2002 may write data to the semiconductor package 2003 or read data from the semiconductor package 2003 and improve an operating speed of the electronic system 2000.

The DRAM 2004 may be a buffer memory configured to reduce a speed difference between the semiconductor package 2003, which is a data storage space, and the external host. The DRAM 2004 included in the electronic system 2000 may operate as a kind of cache memory and provide a space for temporarily storing data in a control operation on the semiconductor package 2003. When the electronic system 2000 includes the DRAM 2004, the controller 2002 may further include a DRAM controller configured to control the DRAM 2004 in addition to a NAND controller configured to control the semiconductor package 2003.

The semiconductor package 2003 may include first and second semiconductor packages **2003*a* and 2003*b*, which are spaced apart from each other. Each of the first and second semiconductor packages 2003*a* and 2003*b* may include a semiconductor package including a plurality of semiconductor chips 2200. Each of the first and second semiconductor packages 2003*a* and 2003*b* may include a package substrate 2100, the plurality of semiconductor chips 2200 on the substrate 2100, an adhesive layer 2300 on a bottom surface of each of the plurality of semiconductor chips 2200, a connection structure 2400 configured to electrically connect the plurality of semiconductor chips 2200 to the package substrate 2100, and a molding layer 2500 covering the plurality of semiconductor chips 2200 and the connection structure 2400 on the package substrate 2100**.

The package substrate 2100 may include a printed circuit board (PCB) including the plurality of package upper pads 2130. Each of the plurality of semiconductor chips 2200 may include an I/O pad 2210. The I/O pad 2210 may correspond to the I/O pad 1101 of FIG. 19. Each of the plurality of semiconductor chips 2200 may include a plurality of gate stacks 3210 and a plurality of channel structures 3220. Each of the plurality of semiconductor chips 2200 may include at least one of the structures of the semiconductor devices 100, 200, 500, and 500A that have been described with reference to FIGS. 2 to 10.

In embodiments, the connection structure 2400 may include a bonding wire configured to electrically connect the I/O pad 2210 to the package upper pad 2130. Accordingly, in the first and second semiconductor packages **2003*a* and 2003*b*, the plurality of semiconductor chips 2200 may be electrically connected to each other using a bonding wire technique and electrically connected to the package upper pad 2130 of the package substrate 2100. In embodiments, in the first and second semiconductor packages 2003*a* and 2003*b*, the plurality of semiconductor chips 2200 may be electrically connected to each other by a connection structure including TSVs instead of the connection structure 2400** for a bonding wire technique.

In embodiments, the controller 2002 and the plurality of semiconductor chips 2200 may be included in one package. In embodiments, the controller 2002 and the plurality of semiconductor chips 2200 may be mounted on an additional interposer substrate, which is different from the main substrate 2001, and the controller 2002 may be connected to the plurality of semiconductor chips 2200 by wirings formed on the interposer substrate.

Figure 15:
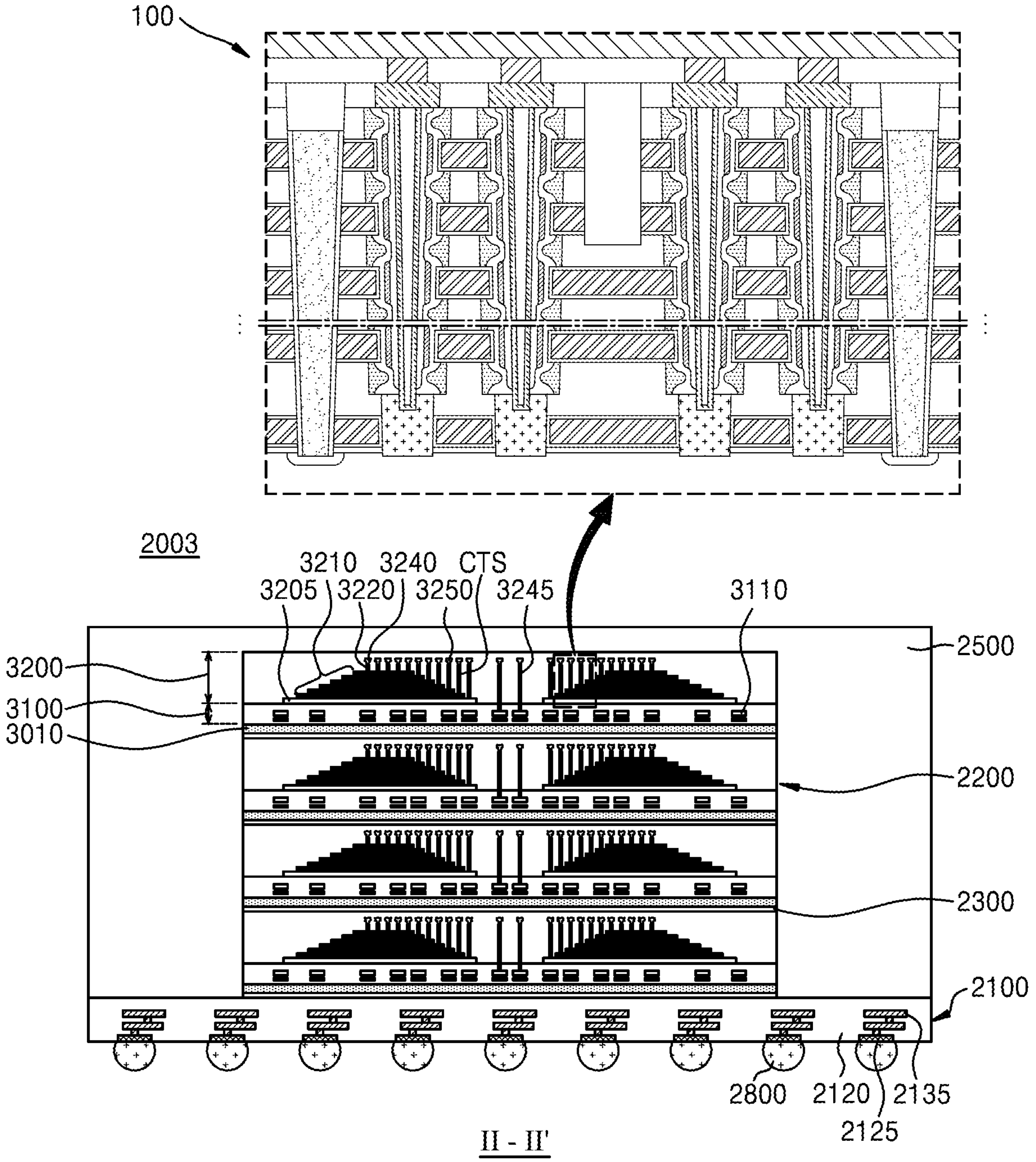
FIG. 15 is a cross-sectional view of semiconductor packages according to embodiments.

FIG. 15 is a cross-sectional view of semiconductor packages according to embodiments. FIG. 15 illustrates a detailed configuration taken along line II-II' of FIG. 14.

Referring to FIG. 15, in a semiconductor package 2003, a package substrate 2100 may include a PCB. The package substrate 2100 may include a package substrate body portion 2120, a plurality of package upper pads 2130 (refer to FIG. 14) on a top surface of the package substrate body 2120, a plurality of lower pads 2125 on a bottom surface of the package substrate body portion 2120 or exposed through the bottom surface thereof, and a plurality of internal wirings 2135 configured to electrically connect the plurality of upper pads 2130 to the plurality of lower pads 2125 in the package substrate body portion 2120. The plurality of upper pads 2130 may be electrically connected to a plurality of connection structures 2400, respectively. The plurality of lower pads 2125 may be connected to a plurality of wiring patterns 2005, which are on the main substrate 2001 of the electronic system 2000 shown in FIG. 14, through a plurality of conductive connectors 2800.

Each of a plurality of semiconductor chips 2200 may include a semiconductor substrate 3010 and a first structure 3100 and a second structure 3200, which are sequentially stacked on the semiconductor substrate 3010. The first structure 3100 may include a peripheral circuit area including a plurality of peripheral wirings 3110. The second structure 3200 may include a common source line 3205, a gate stack 3210 on the common source line 3205, a channel structure 3220 passing through the gate stack 3210, a bit line 3240 electrically connected to the channel structure 3220, and gate connection wirings 3250 electrically connected to word lines (refer to WL in FIG. 13) included in the gate stack 3210 through contacts CTS. In embodiments, each of the plurality of semiconductor chips 2200 may include at least one of the structures of the semiconductor devices 100, 200, 500, and 500A that have been described with reference to FIGS. 2 to 10.

Each of the plurality of semiconductor chips 2200 may include a through wiring 3245, which is electrically connected to the plurality of peripheral wirings 3110 of the first structure 3100 and extends into the second structure 3200. The through wiring 3245 may be outside the gate stack 3210. In other embodiments, the semiconductor package 2003 may further including a through wiring configured to pass through the gate stack 3210. Each of the plurality of semiconductor chips 2200 may further include an I/O pad (refer to 2210 in FIG. 14), which is electrically connected to the plurality of peripheral wirings 3110 of the first structure 3100.

While the inventive concept has been particularly shown and described with reference to embodiments thereof, it will be understood that various changes in form and details may be made therein without departing from the spirit and scope of the following claims.

What is claimed is:

1. A semiconductor device comprising:

a conductive pattern on a substrate, the conductive pattern extending in a lateral direction parallel to a surface of the substrate;

an insulating pattern on the substrate, the insulating pattern extending parallel to the conductive pattern in the lateral direction;

a channel film extending in a vertical direction to the surface of the substrate inside a channel hole passing through the conductive pattern and the insulating pattern;

a charge trap pattern between the conductive pattern and the channel film inside the channel hole;

a tunneling dielectric film between the charge trap pattern and the channel film; and a blocking dielectric film extending in the vertical direction inside the channel hole between the conductive pattern and the charge trap pattern, and between the insulating pattern and the tunneling dielectric film, the blocking dielectric film having a portion extending in the lateral direction beyond the charge trap pattern, wherein the insulating pattern comprises a first insulating pattern overlapping the conductive pattern in the vertical direction and a second insulating pattern protruding in the lateral direction from the first insulating pattern into the channel hole and toward the channel film, the first insulating pattern having a first dielectric constant, and the second insulating pattern having a second dielectric constant that is lower than the first dielectric constant.

2. The semiconductor device of claim 1, wherein the second insulating pattern narrows toward the channel film, and a portion of the blocking dielectric film on the second insulating pattern extends in the lateral direction toward the channel film and beyond a surface of the charge trap pattern.

3. The semiconductor device of claim 1, wherein, in the lateral direction, a first distance between a sidewall of the first insulating pattern, which is closest to the channel film, and the channel film is greater than a second distance between a sidewall of the conductive pattern, which is closest to the channel film, and the channel film.

4. The semiconductor device of claim 1, wherein the second insulating pattern comprises a first portion and a second portion, the first portion overlapping the conductive pattern in the vertical direction, and the second portion overlapping the blocking dielectric film in the vertical direction inside the channel hole, and a thickness of the second portion is less than a thickness of the first portion in the vertical direction.

5. The semiconductor device of claim 1, wherein a first portion of the blocking dielectric film is on the conductive pattern and is in contact with the charge trap pattern, and a second portion of the blocking dielectric film is on the second insulating pattern and is in contact with the tunneling dielectric film.

6. The semiconductor device of claim 1, wherein the blocking dielectric film comprises a portion extending in the vertical direction inside the channel hole and a protrusion protruding in the lateral direction out of the channel hole and toward the first insulating pattern.

7. The semiconductor device of claim 1, further comprising a blocking dielectric liner on the conductive pattern, the blocking dielectric liner being in contact with the blocking dielectric film, wherein the blocking dielectric film comprises a first portion on the conductive pattern with the blocking dielectric liner therebetween, a second portion in contact with the second insulating pattern of the insulating pattern, and a protrusion protruding in the lateral direction out of the channel hole and onto a bottom surface or a top surface of the conductive pattern.

8. The semiconductor device of claim 1, wherein the blocking dielectric film extends in the vertical direction inside the channel hole in a zigzag manner to contact the charge trap pattern at a surface facing the conductive pattern, at a bottom surface facing the substrate, and at a top surface opposite to the bottom surface.

9. The semiconductor device of claim 1, wherein the tunneling dielectric film comprises a first portion in contact with the charge trap pattern, and a second portion in contact with the blocking dielectric film.

10. A semiconductor device comprising:

a plurality of conductive patterns extending on a substrate in a lateral direction parallel to a surface of the substrate, the plurality of conductive patterns overlapping each other in a vertical direction to the surface of the substrate;

a plurality of insulating patterns alternatingly stacked between the plurality of conductive patterns, respectively, the plurality of insulating patterns extending in the lateral direction;

a channel film extending in the vertical direction inside a channel hole passing through the plurality of conductive patterns and the plurality of insulating patterns;

a plurality of charge trap patterns between the plurality of conductive patterns and the channel film inside the channel hole, the plurality of charge trap patterns being spaced apart from each other in the vertical direction;

a tunneling dielectric film between the plurality of charge trap patterns and the channel film; and a blocking dielectric film extending in the vertical direction inside the channel hole between the plurality of conductive patterns and the plurality of charge trap patterns, and between the plurality of insulating patterns and the tunneling dielectric film, wherein each of the plurality of insulating patterns comprises a first insulating pattern overlapping the plurality of conductive patterns in the vertical direction and a second insulating pattern protruding in the lateral direction from the first insulating pattern into the channel hole and toward the channel film, the first insulating pattern having a first dielectric constant, and the second insulating pattern having a second dielectric constant that is lower than the first dielectric constant.

11. The semiconductor device of claim 10, wherein the second insulating pattern narrows toward the channel film, and the second insulating pattern comprises SiOC, SiOCN, SiOB, SiBN, SiOF, or a combination thereof.

12. The semiconductor device of claim 10, wherein each of the plurality of charge trap patterns widens toward the channel film.

13. The semiconductor device of claim 10, wherein respective portions of the blocking dielectric film laterally extend between ones of the plurality of charge trap patterns that are adjacent one another in the vertical direction such that the plurality of charge trap patterns are electrically isolated from one another along the vertical direction.

14. The semiconductor device of claim 10, wherein, in each of the plurality of insulating patterns, the second insulating pattern comprises a first portion overlapping the plurality of conductive patterns in the vertical direction and a second portion overlapping the blocking dielectric film in the vertical direction inside the channel hole and, a thickness of the second portion is less than a thickness of the first portion in the vertical direction.

15. The semiconductor device of claim 10, wherein the blocking dielectric film comprises a portion extending in the vertical direction inside the channel hole and a protrusion protruding in the lateral direction out of the channel hole and toward the first insulating pattern.

16. The semiconductor device of claim 10, wherein the blocking dielectric film extends in a zigzag manner in the vertical direction inside the channel hole, and the blocking dielectric film comprises respective portions that protrude in the lateral direction toward the channel film and beyond the plurality of charge trap patterns.

17. The semiconductor device of claim 10, wherein the blocking dielectric film comprises respective portions in contact with the tunneling dielectric film between adjacent ones of the plurality of charge trap patterns.

18. The semiconductor device of claim 10, further comprising a plurality of blocking dielectric liners on the plurality of conductive patterns, the plurality of blocking dielectric liners being in contact with the blocking dielectric film, wherein the blocking dielectric film comprises a plurality of recess surfaces into which the plurality of conductive patterns laterally extend, respectively.

19. An electronic system comprising:

a main substrate;

a semiconductor device on the main substrate; and a controller electrically connected to the semiconductor device on the main substrate, wherein the semiconductor device comprises:

a conductive pattern on a substrate, the conductive pattern extending in a lateral direction parallel to a surface of the substrate;

an insulating pattern on the substrate, the insulating pattern extending in the lateral direction parallel to the conductive pattern;

a channel film extending in a vertical direction to the surface of the substrate inside a channel hole passing through the conductive pattern and the insulating pattern;

a charge trap pattern between the conductive pattern and the channel film inside the channel hole;

a tunneling dielectric film between the charge trap pattern and the channel film; and a blocking dielectric film extending in the vertical direction inside the channel hole between the conductive pattern and the charge trap pattern, and between the insulating pattern and the tunneling dielectric film, the blocking dielectric film having a portion disposed between the insulating pattern and the conductive pattern in the vertical direction, wherein the insulating pattern comprises a first insulating pattern overlapping the conductive pattern in the vertical direction and a second insulating pattern protruding in the lateral direction from the first insulating pattern into the channel hole and toward the channel film, the first insulating pattern having a first dielectric constant, and the second insulating pattern having a second dielectric constant that is lower than the first dielectric constant.

20. The electronic system of claim 19, wherein the main substrate further comprises wiring patterns configured to electrically connect the semiconductor device to the controller, and, in the semiconductor device, the second insulating pattern narrows toward the channel film and a portion of the blocking dielectric film on the second insulating pattern extends in the lateral direction toward the channel film and beyond a surface of the charge trap pattern.

* * * * *